United States Patent
Markle et al.

(10) Patent No.: US 9,304,410 B2
(45) Date of Patent: Apr. 5, 2016

(54) APPARATUS AND METHOD OF DIRECT WRITING WITH PHOTONS BEYOND THE DIFFRACTION LIMIT

(71) Applicants: David A. Markle, Saratoga, CA (US); Rudolf H. Hendel, Los Gatos, CA (US); John S. Petersen, Austin, TX (US); Hwan J. Jeong, Los Altos, CA (US)

(72) Inventors: David A. Markle, Saratoga, CA (US); Rudolf H. Hendel, Los Gatos, CA (US); John S. Petersen, Austin, TX (US); Hwan J. Jeong, Los Altos, CA (US)

(73) Assignee: Periodic Structures Inc., Los Gatos, CA (US)

( * ) Notice: Subject to any disclaimer, the term of this patent is extended or adjusted under 35 U.S.C. 154(b) by 326 days.

(21) Appl. No.: 14/143,139

(22) Filed: Dec. 30, 2013

(65) Prior Publication Data
US 2015/0331330 A1    Nov. 19, 2015

Related U.S. Application Data

(62) Division of application No. 13/678,692, filed on Nov. 16, 2012, now Pat. No. 8,642,232.

(60) Provisional application No. 61/561,545, filed on Nov. 18, 2011.

(51) Int. Cl.
| | |
|---|---|
| *G03B 27/32* | (2006.01) |
| *G03B 27/54* | (2006.01) |
| *G03C 5/00* | (2006.01) |
| *G03F 7/20* | (2006.01) |

(52) U.S. Cl.
CPC .......... *G03F 7/7045* (2013.01); *G03F 7/70191* (2013.01); *G03F 7/70383* (2013.01); *G03F 7/70408* (2013.01); *G03F 7/70466* (2013.01)

(58) Field of Classification Search
CPC ............ G03F 7/70325; G03F 7/70358; G03F 7/70383; G03F 7/70408; G03F 7/7045; G03F 7/70466
USPC .......................... 355/67, 70, 77; 430/269, 312
See application file for complete search history.

(56) References Cited

U.S. PATENT DOCUMENTS

| | | | |
|---|---|---|---|
| 2005/0088633 A1 | 4/2005 | Borodovsky | |
| 2005/0147921 A1 | 7/2005 | Lin et al. | |
| 2012/0092632 A1* | 4/2012 | McLeod | G03F 7/031 355/53 |
| 2014/0038103 A1* | 2/2014 | Miller | G03F 7/0045 430/270.1 |

FOREIGN PATENT DOCUMENTS

| | | |
|---|---|---|
| CN | 1952789 A | 4/2007 |
| JP | H07-210068 | 8/1995 |

OTHER PUBLICATIONS

Office Action for Taiwan Patent Application No. 101142947, mailed on Feb. 4, 2015.

* cited by examiner

*Primary Examiner* — Colin Kreutzer
(74) *Attorney, Agent, or Firm* — Opticus IP Law PLLC

(57) ABSTRACT

Direct-write lithography apparatus and methods are disclosed in which a transducer image and an image of crossed interference fringe patterns are superimposed on a photoresist layer supported by a substrate. The transducer image has an exposure wavelength and contains bright spots, each corresponding to an activated pixel. The interference image has an inhibition wavelength and contains dark spots where the null points in the crossed interference fringes coincide. The dark spots are aligned with and trim the peripheries of the corresponding bright spot to form sub-resolution photoresist pixels having a size smaller than would be formed in the absence of the dark spots.

20 Claims, 19 Drawing Sheets

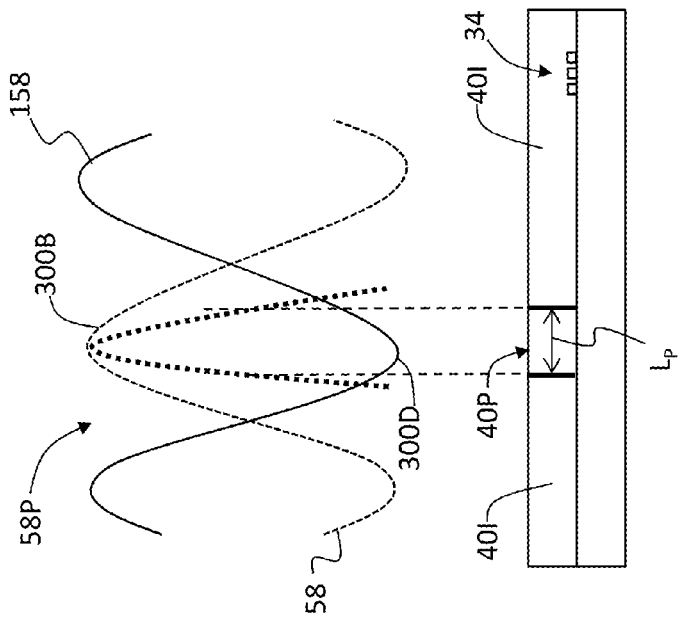
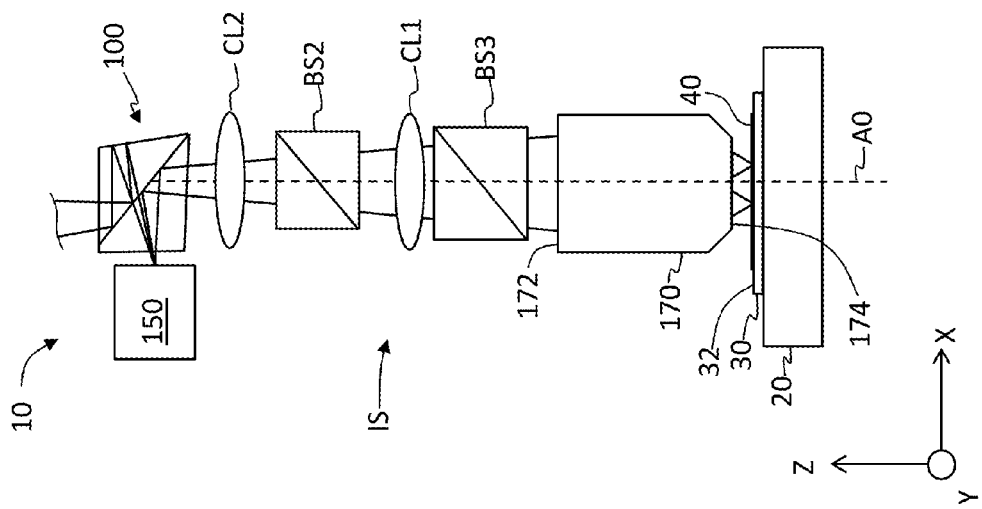
FIG. 5
FIG. 6

APPARATUS AND METHOD OF DIRECT WRITING WITH PHOTONS BEYOND THE DIFFRACTION LIMIT

CLAIM OF PRIORITY

This application is a divisional application of U.S. patent application Ser. No. 13/678,692, filed on Nov. 16, 2012, which is incorporated by reference herein and which claims priority under 35 U.S.C. §119(e) from U.S. Provisional Application Ser. No. 61/561,545, filed on Nov. 18, 2011, which application is incorporated by reference herein.

STATEMENT OF GOVERNMENT RIGHTS

This disclosure was made with government support under Contract # N66001-10-C-406, awarded by DARPA and managed by SPAWAR Systems Center Pacific. The government therefore has certain rights in the disclosure.

FIELD

The present disclosure relates to lithography, and in particular to super-resolution lithography apparatus and methods that utilize direct writing with photons.

BACKGROUND ART

The semiconductor device manufacturing industry has relied on optical lithography techniques since the 1960s to produce ever denser and more powerful integrated circuit (IC) chips. However, the ability to keep reducing the minimum geometry of IC chips is reaching fundamental material limitations. The continued use of optical lithography has been enabled by the employment of increasingly more complex lenses and shorter operating wavelengths. Present-day microlithography lenses rely on liquid immersion to increase the numerical aperture (NA) to a maximum of about 1.33.

Likewise, the optical wavelengths used to expose the photoresist have been reduced from the original g-line of mercury (436 nm) down to the ArF-excimer-laser deep-ultraviolet wavelength of 193 nm. Beyond 193 nm there are no glass materials suitable for use as the lenses, and the transmission of such short-wavelength light through air is problematic. While serious effort is presently being directed toward using extreme-ultra-violet (EUV) wavelengths in the X-ray region at 13.5 nm in combination with mirror systems, it is not yet clear whether EUV lithography systems will be commercially viable.

Optical lithography relies on the ability of photoresist to respond to light incident thereon and thereby record a sharp photoresist image. Conventional mask-based optical lithography is limited mainly by the diffraction limit of the projection imaging process.

U.S. Pat. No. 7,713,684 (hereinafter the '684 patent) describes a direct-write (i.e., non-mask-based, non-projection) optical-lithography technique whereby a thin film is placed above a photoresist layer. The thin film can be bleached by a first wavelength of light and rendered opaque by a second wavelength of light. The '684 patent describes a technique that involves creating a patch of the second wavelength, the center of which contains a small black hole. The hole is irradiated with an image larger than the hole and formed by the first wavelength of light, and if the intensity of the superimposed second wavelength of light is sufficiently low, then the first wavelength of light bleaches and thereby exposes the underlying photoresist layer.

The size of the resultant photoresist image can be as small as 1/13th the size of the image formed using just the first wavelength. This technique and subsequent related techniques whereby an image is formed in photoresist using direct writing to achieve a resolution beyond the usual resolution limits of conventional photolithography are referred to in the art as super-resolution lithography (SRL).

While SRL techniques have been demonstrated and are shown to be feasible, they need to be made commercially viable. This includes developing systems and methods that allow for SRL techniques to be implemented in a manufacturing environment in a manner that provides wafer throughputs similar to those presently available using conventional mask-based optical lithography techniques.

SUMMARY

Aspects of the disclosure include a direct-write lithography apparatus that has a higher throughput than prior-art direct-write lithography systems.

Direct-write lithography apparatus and methods are disclosed in which a transducer image and an interference-pattern image (hereinafter, "interference image") are superimposed on a photoresist layer supported by a substrate. The transducer image has an exposure wavelength and contains bright spots of a first size. The interference image has an inhibition wavelength and contains dark spots, which ideally have zero intensity at their centers and a roughly parabolic intensity profile near their centers. The bright and dark spots are aligned, with the dark spots serving to trim the size of the photoresist pixels formed in the photoresist layer more than would be the case were the photoresist pixels to be formed by the bright spot alone. The result is a sparse array of super-resolution photoresist pixels. The superposition of many exposures, each containing a sparse array of super-resolution pixels, results in a pattern containing a desired configuration of super-resolution pixels.

The terms "apparatus" and "system" are used interchangeably herein.

The two-dimensional array of beams for writing the pattern starts with a commercially available mirror array that is capable of generating 2,000,000 independent writing beams.

The single broadband objective lens images all 2,000,000 pixels simultaneously rather than requiring a separate lens for each pixel. A refractive lens efficiently gathers all the light from an image-transducer pixel and concentrates it on a small region on the image. This feature is not available with zone plates that have very small fields, very restricted spectral ranges, and efficiencies of about 40%, assuming they are made of alternating rings of transparent and opaque materials.

The color-corrected imaging system does not place stringent spectral constraints on the exposure source used to illuminate the image transducer, the inhibition source used to generate the orthogonal fringe patterns, or the source used to illuminate the pre-existing patterns of the substrate for alignment.

The alignment system allows the inhibition interference pattern and the exposure-image transducer-pixel pattern to be viewed simultaneously or in rapid succession by a camera so that they can be accurately aligned. It also permits "through-the-lens" alignment of the image transducer pattern with pre-existing patterns on the substrate using a variety of different wavelengths. This is not possible with a zone-plate-array-based system.

An extended, two-dimensional, inhibition-wavelength interference pattern is capable of yielding very high contrast imagery over a very large depth of focus (~10 microns) that extends over the entire region in which the two interfering beams overlap. By comparison the LumArray approach requires the use of a separate dichroic zone-plate to generate each inhibition-wavelength hole, and the depth of focus is about the same as it would be for a lens employing the same wavelength and NA, typically less than a micron. Zone plates work best at a single wavelength. A dichroic zone plate compromises the efficiency at both wavelengths in order to operate at two wavelengths.

The very high bandwidth positioning system can move the inhibition interference pattern very quickly and precisely in order to position the high-resolution feature exactly where it is needed. This ability reduces the performance requirements of the stage and simplifies the task of converting the graphic database system (GDS) mask data into the data streams necessary to drive the image transducer. The high bandwidth positioning system is achieved by using Pockels cells, Kerr cells, piezo-optic devices or acoustic modulators in the beam paths used to generate the two orthogonal interference patterns.

A synchronous scanning system allows the super-resolution pixels created by the interference patterns to be moved in synchronism with the substrate during the exposure. Typically, during exposure the interference patterns move continuously along with the scanning stage while the static image-transducer pattern remains stationary, changing only between exposures. Typically the width of the static image from a single image-transducer pixel is about twice the travel distance of the super-resolution pixel during an exposure. Synchronous scanning eliminates the image blurring that occurs if the substrate moves and the image doesn't and greatly reduces the source brightness required for an exposure.

An exposure source might consist of a number of laser diodes coupled to a light pipe whose output end is imaged onto the image transducer and whose diodes are operated intermittently to expose the substrate. This arrangement is known to produce an illumination uniformity of about ±1%—a typical requirement for a lithography illumination system.

The viability of super-resolution lithography depends on the ability to obtain a very high contrast ratio in the inhibition interference pattern. Any appreciable inhibition light in the center of the dark spot (black hole) between the orthogonal fringes can result in an underexposed or a missing image. A very high contrast is assured by the use of a common laser source and a diffraction grating to generate ±1 orders and by blocking other possible orders. Even if the illumination across the grating is not uniform, this non-uniformity will have little if any effect on the image contrast, because the grating is imaged directly on the substrate. This rigor is not available with zone plates, with which there is no way of eliminating other possible orders. It may prove very difficult to achieve the desired image contrast, especially with a dichroic zone plate.

The reliability of a lithography system used in high-volume manufacture is of the utmost importance. The undetected failure of a single pixel in the image transducer, of a single laser diode in the inhibition or exposure illumination paths or of one of the fringe shifters could lead to the scrapping of millions of dollars of product wafers. An occasional failure of any of these components cannot be ruled out, but with the system described, the failure of any of these components can be detected quickly and easily.

The camera unit can be used to monitor the performance of each pixel in the image transducer, each fringe shifter, and even the brightness and uniformity of the inhibition and exposure illumination systems. In addition, an integrated intensity monitor can be used to assess the image intensity contributed by any one pixel, any group of pixels, or all the pixels. This kind of closed-loop monitoring does not appear to be a part of the other systems described for use with two-color, super-resolution imagery.

A very compact arrangement of each objective lens and its associated focus and illumination sub-systems allows an array (columns) of such systems to be positioned over a substrate so that the throughput is proportional to the footprint area of each column rather than to the area of the substrate. For a 300-mm-diameter substrate a two-dimensional array of columns may be used to increase the throughput thirty-twofold.

The combination of technology choices ranges from a variety of commercially available image transducers containing up to about two million pixels to the number of columns, which can range from one to a two-dimensional array of columns, with each column containing an objective. Each of these technology choices provides a throughput-to-cost ratio that is comparable with that of state-of-the-art lithography equipment, but the capital cost ranges widely, from the needs of a small research group to the very different needs of a volume manufacturer. This, plus the capability of taking a well-understood and familiar technology to resolutions of about 10 nm, will provide sufficient incentive to drive the development both of two-color resist systems and of image transducers with many more pixels and other properties specifically matched to the needs of lithography. Previous hardware concepts did not meet the throughput threshold that would have made them viable for high-volume production and therefore did not attract the funding necessary for a supportive resist-and-image-transducer infrastructure.

The disclosure includes a number of different aspects, as described immediately below.

An aspect of the disclosure is a direct-write lithography system that has one or more image transducers containing pixels arranged in rows and columns. An illuminator system illuminates the one or more image transducers with exposure radiation. An objective images the one or more image transducers onto a substrate surface. The image transducers can be reflective or absorbing. A substrate supports a photoresist layer or a resist layer with a coating on top, which is exposed with exposure radiation and in which the exposure is inhibited by inhibiting radiation. The system includes an interference pattern generator that generates two coherently related beams of inhibiting radiation. These beams are brought to focus on opposite sides of the pupil of the objective lens so that overlapping collimated beams are projected to the substrate plane, where they interfere to form a parallel fringe pattern oriented parallel to the pixel rows in the transducer image.

The interference pattern generator also forms two other coherently related beams of inhibiting radiation, which either are not coherently related to the other two beams or are polarized orthogonally to the other two beams. The second pair of beams is brought to focus on opposite sides of the pupil of the objective lens to the first pair of beams so that overlapping collimated beams are projected to the substrate plane. The two pairs of beams each define a set of parallel fringes that cross at right angles and so collectively define a grid pattern in the photoresist layer. In an example, a third pair of coherently related beams can be used, with the three pairs of beams being symmetrically arranged relative to one another.

In an example, fringe shifters are used to shift each fringe pattern with respect to the transducer image on the substrate so that intensity minima (dark spots) between the overlapping fringe patterns can be aligned with the center of every bright spot in the transducer image.

In an example, a metered stage supports the substrate.

In an example, an image-transducer control system uses fractured pattern data to generate a series of exposure frames. Each frame contains a sparse pattern of isolated pixels, each one smaller than the image of the image-transducer pixel used to expose it, and these frames, when superimposed on the substrate, form a pattern having minimum feature sizes limited by the size of the smallest isolated pixel.

The system includes an alignment system configured to align the interference image and the transducer image with one another, so that during exposure each "on" pixel image is defined by the fringe-pattern minima and the image-transducer pixel on which it lies.

The system also has an exposure control system. Once alignment is achieved, the exposure control system allows exposure radiation to reach the substrate for a duration sufficient to deliver the desired exposure dose, and sets the ratio between the inhibition and exposure intensities during exposure to the desired value.

Another aspect is the system described above, in which the active pixels are arrayed like the white squares on a checkerboard. In an example, the image transducer is a digital mirror device (DMD) such as the Texas instruments 1080p DMD. Using such a DMD, the system can write 2,073,600 pixels at a time with a 20,000 Hz frame rate. Assuming a 20-nm resolution, this rate corresponds to a writing rate of 16.6 mm$^2$/s.

Another aspect is the system described above, wherein the phase shifters in the inhibition beam paths are employed to synchronize the movement of the fringes with the movement of the substrate during exposure so that there is no image smearing.

Another aspect is the system described above, wherein the phase shifters that move the fringes oriented parallel to the scan direction produce a jog in the pixel position after every N exposures so that the orientation of the pixels in the image is kept the same as the orientation of the pixels in the image transducer.

Another aspect is the system described above, wherein the system includes means for finely adjusting the positions of the four point sources of inhibiting radiation in the objective pupil so that the orientation and spacing (magnification) of the two fringe patterns can also be finely adjusted.

Another aspect is the system described above, wherein the image transducer operates at its maximum frame rate, the stage travels in a straight line at a constant velocity and the incremental motion of the image of a fixed pixel in the image transducer across the substrate in the scan direction varies in an irregular fashion from exposure to exposure so that the stage velocity varies with the number of pixels in the image transducer in the scan direction divided by $N^2$, where $N^2$ is the number of exposures required to completely fill in the area around a pixel and where the result of the division may be a fractional number.

Another aspect is the system described above, wherein the system includes means for varying the imaged pixel size over a wide range by varying the inhibition intensity while keeping the exposure intensity relatively constant and also includes: a) a variable scan rate for the stage and for the fringe pattern, which is oriented orthogonal to the scan velocity during the exposure; b) a different and possibly irregular travel increment of a fixed image-transducer pixel image on the substrate in the scan direction between exposures; and c) a fractured database that takes into account the desired pixel size and the irregular travel-distance increments in the scan direction between exposures.

Another aspect is the system described above, in which the peak exposure intensity of a single pixel is ideally 1.5 times the threshold value after compensating for any residual inhibition radiation at the pixel center and within a value of 1.333 and a value of 1.82 of the threshold value.

Another aspect is the utilization of a number of systems to perform lithography concurrently and efficiently on a substrate having a given size and shape.

Another aspect is the system described above, where the possible location of pattern edges is incremented by the pixel size and no attempt is made to provide a gray scale that serves to locate a pattern edge in increments of a partial pixel.

Another aspect is the system described above, wherein the system includes a dichroic beam splitter that brings the coherently related beams of inhibiting light into the imaging path of the objective so that they are focused on opposite sides of the objective pupil and that also brings the exposure radiation from the image transducer to the objective.

Another aspect is the system described above, wherein the system includes fibers to bring the coherently related beams of inhibiting light into the objective lens.

Another aspect is the system described above, wherein the system includes an alignment system operable to correct overlay errors by measuring the offsets from an ideal nominal location for the layer to which good alignment is desired, and then applying offsets for the stage position, thereby minimizing the overlay errors.

Another aspect is the system described above, wherein the system also includes two image transducers arranged side-by-side but having a small relative registration error of half a pixel in both the row and column directions so that the superposition of the frames from each transducer results in overlapping pixels on the substrate, which enables an edge position to be defined at an increment of one half-pixel.

Another aspect is the system described above, wherein the system includes a means of introducing a small amount of inhibition light evenly distributed over the objective image field that sets a minimum intensity for resist exposure to occur from any stray exposure light.

Another aspect is the system described above, where the useful area of each pixel on the image transducer is restricted to a small area in the center, which reduces the amount of light generated by one pixel in the array and thereby prevents that light from adding substantially to the light received in the center of the image of a neighboring pixel.

Another aspect is the system described above, wherein the system includes in each of the interference beam pair paths a fringe shifter.

Another aspect is the system described above, wherein the system includes a controller for each fringe shifter. The controllers receive fringe-position error signals and generate drive signals to the fringe shifters to null the position error signal.

Another aspect is the system described above, wherein a camera is used to view the image of the substrate through the same objective used to form an image of the image transducer.

Another aspect is the system described above, wherein the field of view of the camera covers more than half the area of the image of the image transducer on the substrate.

Another aspect is the system described above, wherein the camera has at least four times as many pixels than the number of image-transducer elements contained in the camera's field of view.

Another aspect is the system described above, wherein the system includes a stage control system that compares the metered stage position with the ideal stage position required for the pattern data to generate position error signals for the fringe shifters.

Another aspect is the system described above, wherein the stage scans along a path that is slightly skewed with respect to the Y-axis, the Y-axis being defined by the orientation of the image-transducer pixels, and successive exposures are laid down along another path aligned with the Y-axis with occasional jogs in the X-direction.

Another aspect of the disclosure is a method that employs the system as described above, wherein the aforementioned camera is used to measure the position of the inhibition fringe pattern relative to the image-transducer position. The relative position is compared with the ideal alignment position, taking into account any position shifts introduced by the acoustic modulator system to compensate for stage-position errors, and the result of that comparison is used to generate fringe-position correction signals.

Another aspect of the disclosure is a method that employs the system as described above, wherein the method includes reducing overlay errors caused by motion of the substrate on the stage during the exposure process. The positions of an existing pattern on the wafer are mapped just prior to the exposure of that area using alignment targets or other position fiducials. The differences between the estimated position and the measured position are applied as real-time corrections to the imagery such that any overlay between the existing patterns and the patterns currently being generated is reduced.

Another aspect of the disclosure is a method that employs the system as described above, wherein the aforementioned camera is used to compare the spacing between the inhibition fringes and the spacing between the image-transducer pixels in both orthogonal directions and signals are produced that are proportional to the spacing difference.

Another aspect of the disclosure is the system as described above, wherein the exposure light source is turned on for the exposure and the dark spots move with the substrate and traverse a portion of the width of the bright spots of the transducer image during the exposure time.

Another aspect of the disclosure is the system as described above, wherein a beam splitter is introduced into the path between the imaging objective and the image transducer to provide light reflected from the substrate for viewing the substrate pattern as well as the superimposed transducer and interference images.

Another aspect of the disclosure is the system as described above, wherein the aforementioned camera is monochrome, i.e., does not yield a color picture, and spans the spectrum extending from the exposure wavelength, which is used to illuminate the image transducer, through to the inhibition wavelength, which is used to create the crossed fringe pattern.

Another aspect of the disclosure is a method that employs the system as described above, wherein spectrally selective filters are inserted into the optical path between the beam splitter and the camera so that the inhibition fringe pattern, the exposure-wavelength-illuminated image-transducer pattern or the existing pattern on the substrate, or any combination of these, is emphasized or enhanced in the picture produced by the camera.

Another aspect of the disclosure is a method that employs the system as described above, whereby the aforementioned camera is used to measure the position of the inhibition fringe pattern with respect to the position of the image transducer as well as to compare the position of the pattern projected onto the substrate with the ideal alignment position derived from the existing targets on the substrate, taking into account any position shifts introduced by the fringe shifting system to compensate for stage position errors, with the result of that comparison being used to generate fringe-position correction signals.

Another aspect of the disclosure is a method that employs the system as described above, whereby the aforementioned camera is used to compare the spacing between the inhibition fringes in the interference image and the spacing between the image-transducer pixels in the transducer image in both orthogonal directions, and in response to generate signals representative of the spacing difference.

Another aspect of the disclosure is the system as described above, wherein the system includes electrically activated, fine tilt-angle adjustments on each of two gratings in the interference pattern generator that allow the gratings to be tipped such that they are parallel along an axis parallel to the grating lines and preferably through the grating center.

Another aspect of the disclosure is a method that employs the system as described above, whereby the inhibition-fringe spacing-error signals are used to rotate each of the orthogonal gratings about an axis parallel to the grating-line direction and located near the center of the grating so as to change the inhibition-fringe spacing relative to the image transducer-pixel spacing.

Another aspect of the disclosure is the system as described above, wherein the system includes a detector or a detector array that views a portion of the light from the image transducer that is directed toward the imaging objective and that can be used to measure the intensity and uniformity of the exposure beam.

Another aspect of the disclosure is a method that employs the system as described above, wherein the method includes a detector array that views a portion of the light from the image transducer directed toward the imaging objective pupil and that is used to measure the distribution of light in the objective pupil.

Another aspect of the disclosure is the system as described above, wherein the system includes a frustrated reflection prism that transmits incoming illumination onto the image transducer at an incident angle that departs from normal incidence by twice the mirror tilt angle, and that reflects toward the imaging objective normally incident light reflected by the image transducer.

Another aspect of the disclosure is the system as described above, wherein the useful area of each pixel is restricted to a small area in the center of each micro-mirror substrate in order to reduce the amount of light generated by any one pixel in the array, thereby preventing that light from adding substantially to the light received in the center of the image of a neighboring pixel.

Another aspect of the disclosure is a method that employs the system as described above, wherein the method includes checking the performance of every pixel in the image transducer by turning all the pixels off and then checking the camera image to see if any remain on, and then turning them on one-by-one or in small groups and measuring the resultant exposure intensity using the camera.

Another aspect of the disclosure is the system as described above, wherein the system includes a data path that incorporates a super-computer that accepts an entire compressed, rasterized, integrated chip layer, stores it in memory and outputs uncompressed data to the one or more image transducers.

Another aspect of the disclosure is the system as described above, wherein the objective field contains two or more image transducers arranged so that the nearest edges between them are orthogonal to the scan direction.

Another aspect of the disclosure is the system as described above, wherein a pupil stop of the objective lens is underfilled so that spatially coherent illumination is employed.

Another aspect of the disclosure is a method that employs the system as described above, wherein the four active pixels closest to a given pixel have a phase shift at the exposing wavelength relative to the given pixel and wherein the phase shift is optimized to minimize the influence of the surrounding pixels on the exposure created by the given pixel.

Another aspect of the disclosure is the system as described above, wherein the pupil stop of the objective is underfilled, i.e., wherein spatially coherent illumination is employed.

Another aspect of the disclosure is the system as described above, wherein a number of exposure systems are packed together in a linear array arranged orthogonal to the substrate scan direction.

Another aspect of the disclosure is a method that employs the system as described above, wherein the exposure systems are arranged in a two-dimensional array that spans the substrate to be exposed.

Another aspect of the disclosure is a direct-write lithography system for printing sub-resolution pixels in a photoresist layer on a substrate. The system includes: an illumination system configured to provide substantially uniform illumination light of an exposure wavelength capable of activating the photoresist; at least one image transducer having an array of configurable transducer pixels arranged to receive and selectively modulate the illumination light; an objective lens arranged to receive the modulated illumination light from the at least one image transducer and form on the photoresist layer a transducer image having an arrangement of bright spots, with each bright spot having a first size and being formed by a corresponding activated transducer pixel; an interference pattern generator arranged relative to the objective lens and adapted to generate light beams of an inhibition wavelength capable of inhibiting the activation of the photoresist, wherein the objective lens is configured to receive the light beams to form therefrom on the photoresist an interference image having a grid pattern that defines an array of dark spots. The interference and transducer images are superimposed on the photoresist layer to perform an exposure, with each bright spot aligned with a corresponding dark spot, so that each aligned dark spot trims a periphery of the corresponding bright spot so that the bright spots form sub-resolution photoresist pixels having a size smaller than if the dark spots were absent.

Another aspect of the disclosure is the direct-write system, wherein the bright spots have respective centers and wherein the interference pattern generator includes a plurality of fringe shifters configured to shift the grid pattern of the interference image to move the dark spots with respect to the centers of the bright spots, the fringe shifters having a servo-bandwidth of 40 kHz or greater.

Another aspect of the disclosure is the direct-write system, wherein the configurable transducer pixels are arrayed like the white squares on a checkerboard.

Another aspect of the disclosure is the direct-write system, further comprising: a camera unit arranged to view the substrate through the objective lens to capture an image of the transducer image and the interference image as formed on the substrate; a moveable stage that operably supports the substrate, wherein the substrate includes an alignment mark; and an alignment system operably coupled to the camera unit and the moveable stage, the alignment system configured to measure relative positions of the superimposed transducer and interference images and the alignment mark.

Another aspect of the disclosure is the direct-write system, wherein the exposure wavelength is nominally 405 nm and the inhibition wavelength is nominally 532 nm.

Another aspect of the disclosure is the direct-write system, further including a movable stage that supports the substrate, the interference pattern generator includes fringe shifters, and wherein a control system causes the fringe shifters to move the grid interference pattern in synchrony with movement of the moveable stage during exposure.

Another aspect of the disclosure is the direct-write system, wherein the substrate has an area and wherein the movable stage is configured to scan the substrate back and forth at constant velocity under the objective lens during the exposure and between exposures to expose substantially all of the substrate area.

Another aspect of the disclosure is the direct-write system, wherein the sub-resolution pixels have a size in the range from 5 nm to 100 nm.

Another aspect of the disclosure is the direct-write system, wherein the transducer pixels are micro-mirrors that have first and second states, and wherein in the first state the micro-mirrors are irradiated with illumination light from a first direction and in the second state are irradiated with inhibition light from a second direction, wherein the exposure and inhibition light is directed through the objective lens to the photoresist layer.

Another aspect of the disclosure is a method of performing direct-write lithography in a photoresist layer. The method includes: forming on the photoresist layer a first transducer image having an exposure wavelength and comprising a first array of first bright spots; superimposing on the transducer image at the photoresist layer two or three interference fringe patterns oriented symmetrically to each other and having an inhibition wavelength which forms an interference image that defines an array of dark spots; and performing a first exposure by aligning first ones of the dark spots and the first bright spots, wherein the each first dark spots trims a periphery of the correspondingly aligned first bright spot so that the first bright spots form a first set of sub-resolution photoresist pixels having a size smaller than would be formed in the absence of the dark spots.

Another aspect of the disclosure is the method described above, further comprising: forming a second array of second bright spots; and performing a second exposure after aligning second ones of the dark spots and the second bright spots, to form a second set of sub-resolution photoresist pixels.

Another aspect of the disclosure is a method of performing direct-write lithography in a photoresist layer. The method includes: forming on the photoresist layer an image of a transducer having an array of transducer pixels with a select orientation, the transducer image having an exposure wavelength and comprising an array of bright spots of a first size that correspond to activated transducer pixels in the array of transducer pixels; superimposing on the transducer image at the photoresist two or three interference fringe patterns oriented symmetrically about an axis normal to the photoresist resist layer and having an inhibition wavelength which form an interference image that defines an array of dark spots; and performing an exposure by aligning the dark spots and the bright spots, wherein the each aligned dark spot trims a periphery of the corresponding bright spot so that the bright spots form sub-resolution photoresist pixels having a size smaller than if the dark spots were absent.

Another aspect of the disclosure is the method described above, wherein the interference image has a pattern formed by: generating two or three pairs of light beams, with the light beams in each pair being capable of interfering with each other, and with the light beams of different pairs not being capable of interfering with each other; passing at least one of each light beam in each pair through respective fringe shifters to create a relative phase-shift between the beams in each pair of the light beams; and collimating the two or three pairs of phase-shifted light beams with an objective lens and directing the collimated, phase-shifted light beams to the substrate.

Another aspect of the disclosure is the method described above, and further comprising repeating the exposure process to form multiple rows of sub-resolution pixels having an orientation that is the same as the select orientation of the array of transducer pixels.

Another aspect of the disclosure is the method described above, wherein the interference image defines a pattern having a position, and wherein repeating the exposure process includes employing the fringe shifters to create a jog in the grid pattern position after a select number of exposures in order to maintain said same orientation.

Another aspect of the disclosure is the method described above, including adjusting a spacing between the fringes in each of the two or three interference fringe patterns.

Another aspect of the disclosure is the method described above, including adjusting an angular orientation of the two or three interference fringe patterns.

Another aspect of the disclosure is the method described above, wherein the transducer comprises a digital mirror device having at least 1 million pixels.

Another aspect of the disclosure is the method described above, wherein the interference image defines a pattern and further including synchronously moving the substrate and the pattern relative to the transducer image during the exposure.

Another aspect of the disclosure is the method described above, wherein the interference image defines a grid pattern further including shifting the grid pattern of the interference image to align the dark spots with the bright spots.

Another aspect of the disclosure is the method described above, including defining an edge of a pattern made up of sub-resolution pixels, wherein the position of the edge is defined to a resolution of the size of one sub-resolution pixel.

Another aspect of the disclosure is the method described above, including capturing an image of the superimposed interference and transducer images through an objective lens; and using the captured image to perform alignment of the superimposed interference and transducer images.

Another aspect of the disclosure is the method described above, further including performing a plurality of exposures of the photoresist layer, with each exposure containing a sparse pattern of isolated super-resolution pixels, thereby forming set of super-resolution pixels having a density greater than the sparse pattern.

Another aspect of the disclosure is the method described above, further including performing multiple exposures to form a pattern made up of sub-resolution pixels, wherein each exposure utilizes all of the transducer pixels.

Another aspect of the disclosure is the method described above, wherein the photoresist has a threshold exposure dose, and wherein each bright spot has an exposure dose that is at least 1.5 times the threshold exposure dose.

Additional features and advantages of the disclosure are set forth in the Detailed Description that follows and in part will be readily apparent to those skilled in the art from that description or recognized by practicing the embodiments as described herein, including the Detailed Description that follows, the claims as well as the appended drawings. The claims constitute a part of this specification and are hereby incorporated into the Detailed Description by reference.

It is to be understood that both the foregoing general description and the following Detailed Description presented below are intended to provide an overview or framework for understanding the nature and character of the disclosure as it is claimed. The accompanying drawings are included to provide a further understanding of the disclosure and are incorporated into and constitute a part of this specification. The drawings illustrate various embodiments of the disclosure and together with the description serve to explain the principles and operations of the disclosure.

The claims set forth below constitute a part of this specification and in particular are incorporated into the Detailed Description set forth below.

All documents cited herein are incorporated by reference.

BRIEF DESCRIPTION OF THE DRAWINGS

FIG. 5 is a schematic diagram of an example imaging system for the direct-write lithography apparatus of FIG. 1;

FIG. 6 is a schematic diagrams illustrating how the intensities of the interference image and the transducer image combine to form a super-resolution pixel in the photoresist layer;

Figure 1:
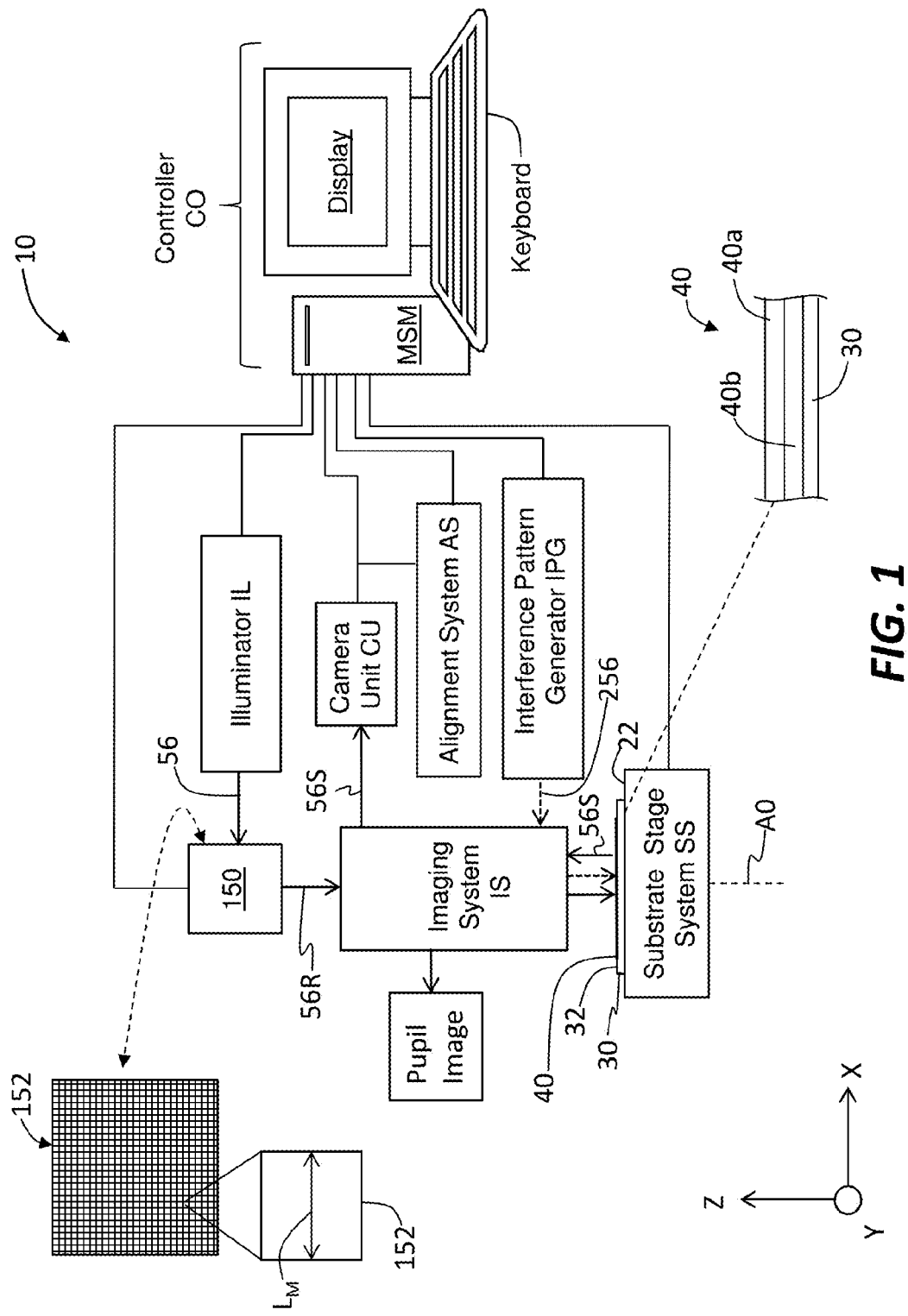
FIG. 1 is a schematic diagram of a generalized version of a direct-write lithography apparatus according to the disclosure.

Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure.

In some of the Figures, Cartesian coordinates are provided for the sake of reference and are not intended as providing limitations on specific directions and orientations of the systems and methods described herein.

DETAILED DESCRIPTION

Reference is now made in detail to various embodiments of the disclosure, examples of which are illustrated in the accompanying drawings. The claims as set forth below are incorporated into and constitute a part of this Detailed Description. All references cited in this document are incorporated by reference herein.

The present disclosure relates to lithography, and in particular to super-resolution lithography apparatus and methods that utilize direct writing with photons. The combination of interference lithography and direct-write lithography permits the writing of a great many points simultaneously while also achieving imagery well below the diffraction limit for the wavelength and numerical aperture (NA) being employed. Generally speaking, interference lithography generates an array of equally spaced lines and spaces that extend across an entire field. More specifically, in this case, the lines and spaces extend across the field of a lithography objective in two orthogonal directions, or possibly three directions oriented 120° apart, by way of inhibition light that inhibits a polymerization reaction or other photochemical process.

In this document, the word "inhibition" refers to the wavelength used to inhibit the resist exposure, while the word "exposure" refers to the wavelength used to promote the resist exposure.

In other situations, "inhibition" and "exposure" can refer to the same wavelength, but inhibition is a low level of radiation that is more or less continuously applied to generate the two-dimensional interference pattern that inhibits exposure, and exposure is a much shorter, much higher intensity pulse of radiation directed primarily at the lowest intensity points in the two-dimensional interference pattern generated by the inhibition illumination to cause exposure. The regions where the interference patterns reach a minimum intensity are called "dark spots" and can also be called "black holes," as they represent the absence of light in the interference image.

Also, the terms "rows" and "columns" are used for reference and are not necessarily intended to be limiting as to orientation; these terms can be used interchangeably.

The following definitions are used herein:

Period: The distance between adjacent pixels at the objective image plane or the substrate plane.

Frame: The resist pattern on the substrate that results from a single exposure.

Column: An assembly containing one objective and at least one image transducer that is capable of patterning a resist layer.

Digital Micro-mirror Device (DMD): A specific type of image transducer that employs an array of micro-mirrors, each of which can be tilted so that the mirror normal falls on either side of the normal to the device.

DMD pixel: An individual DMD micro-mirror.

Photoresist pixel: The area on the resist layer that corresponds to the geometrical image of an image transducer (e.g., DMD) pixel.

Image pixel: An individual image element such as the image of a DMD micro-mirror (pixel) formed at the substrate.

Exposure light: Light having an exposure wavelength $\lambda_1$ that activates (exposes) the photoresist to form a photoresist pattern.

Inhibition light: Light having an inhibition wavelength $\lambda_2$ that causes the photoresist to be insensitive to the exposure light.

General Direct-Write Lithography Apparatus

FIG. 1 is a schematic diagram of a generalized version of a direct-write lithography apparatus ("apparatus") 10 according to the disclosure. The apparatus 10 includes an illuminator system ("illuminator") IL, which is in optical communication with an image transducer 150, such as a DMD. The image transducer 150 is in optical communication with an imaging system IS, which in turn is in optical communication with a substrate 30 supported by a substrate stage system SS. The image transducer 150 is configured to receive and modulate light, e.g., by reflection, transmission, absorption or other known light-modulation means, on a pixel-by-pixel basis.

A camera unit CU is in optical communication with the substrate 30 via reflected light 56S that passes back through the imaging system IS to a beam splitter, which directs the light toward the camera unit, as explained in greater detail below. The apparatus 10 also includes an interference pattern generator IPG that is in optical communication with substrate 30 through imaging system IS. The apparatus 10 includes a primary axis A0, along which resides imaging system IS and substrate stage system SS.

The substrate 30 includes a top surface 32, upon which is supported a layer of photoresist 40. In an example, photoresist 40 can comprise chemical components that photo-chemically respond to exposure (actinic) light, resulting in a change in the solubility of the photoresist by a developer agent, and that can be turned off or negated by inhibition light. Alternatively, photoresist 40 can comprise a conventional resist material ("layer") 40b, over which is laid a layer of photochromic material ("layer") 40a that can be bleached by exposure light and rendered opaque by inhibition light (see inset in FIG. 1). Photoresist compositions that become insoluble after exposure to actinic radiation, usually due to a polymerization reaction, are called "negative resists." Likewise, photoresists that become soluble after actinic exposure, usually due to their changing from a non-polar compound to a polar compound with a much higher solubility in a base developer, are called "positive resists."

Thus, photoresist 40 can consist of a single layer or can consist of first and second layers 40a and 40b, where layer

40a is an inhibiting layer activated by light of wavelength $\lambda_2$ and layer 40b is an exposure layer sensitive to exposure light of wavelength $\lambda_1$. Other layers that might also be included along with the resist and inhibiting layers are not specifically noted. For example, these might include antireflection coatings.

The apparatus 10 also includes an alignment system AS that employs the camera unit CU to view the substrate 30 and the transducer image formed thereon as projected onto the substrate through imaging lens IS.

In the general operation of apparatus 10, illuminator IL generates substantially uniformized illumination light 56 at a first (exposure) wavelength $\lambda_1$. The uniformized illumination light 56 is received by image transducer 150, which in the case of a DMD includes a large number (e.g., over 1 million, and in another example, about 2 million) tiltable mirror elements ("micro-mirrors") 152. Micro-mirrors 152 are switchable to create a series of patterns that when illuminated by light 56, the light reflects therefrom to form reflected light 56R that includes the series of patterns.

Figure 4:
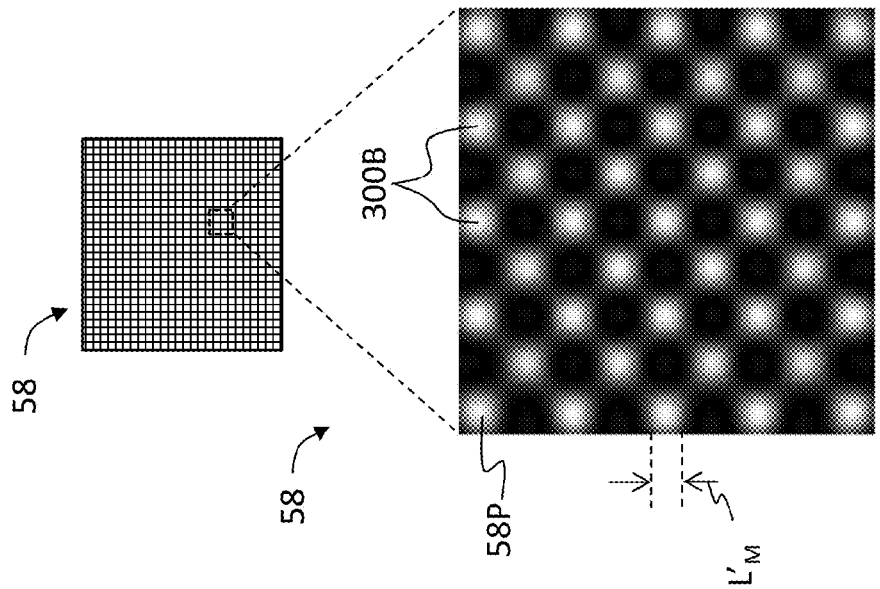
FIG. 4 shows a close-up view of an example transducer image that includes an array of bright spots that align with select dark spots in the interference image.

Most of reflected light 56R from image transducer 150 is imaged by imaging system IS into photoresist layer 40 and forms a transducer image 58 (see FIG. 4). A portion of light 56R is reflected from the substrate 30, passes through the imaging system IS again and is directed to camera unit CU via a beam splitter, which forms an image of the substrate pattern and the superimposed transducer and interference images thereon, and in response generates an electrical transducer-image signal ST (see FIG. 2A). The superimposed images of previous layers applied to the substrate 30 and the projected image-transducer patterns can be used for alignment.

Figure 3:
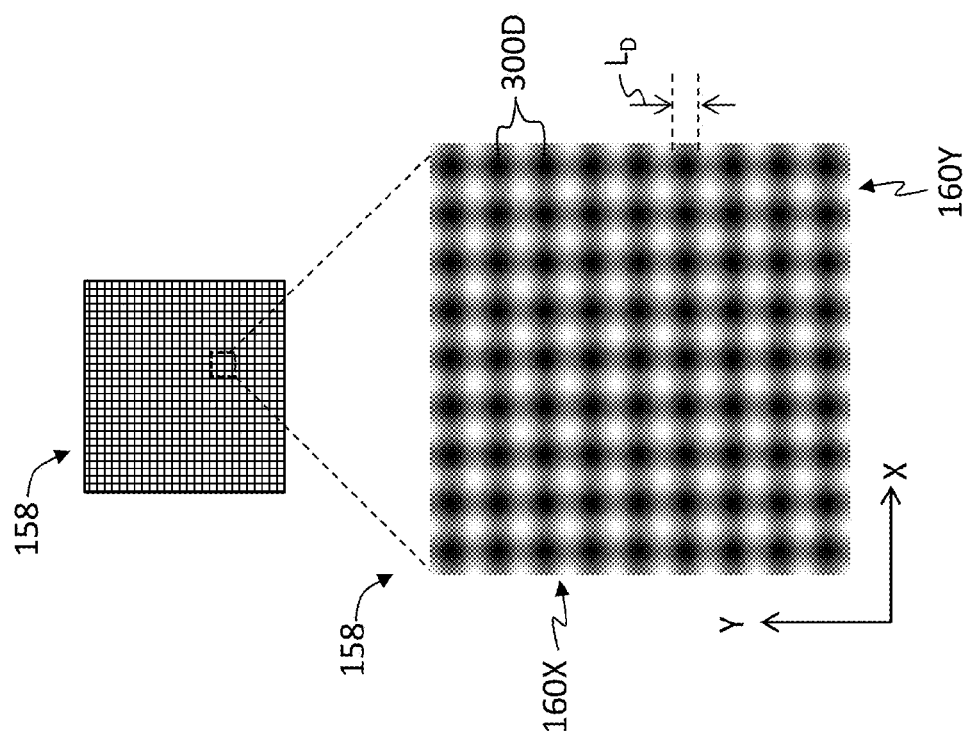
FIG. 3 shows a close-up view of an example interference image, which includes an array of dark spots.

Meanwhile, interference pattern generator IPG generates interference light 256 of a second wavelength $\lambda_2$ that, when imaged by imaging system IS at photoresist layer 40, forms an interference image 158 that in an example consists of first and second line fringe patterns 160X and 160Y that are oriented in orthogonal directions and do not interfere with each other (see FIG. 3). It is also possible to add a third fringe pattern and in this case the fringe patterns are oriented at 120° to each other and the image transducer pixels are arranged in a close-packed array having 3-axis of symmetry. The image on photoresist layer 40 thus has a fine grid pattern superimposed on the transducer image 58. The dynamics of the interaction of the transducer image 58 and the interference image 158 with photoresist layer 40 to achieve very high imaging resolution patterning at a relatively high throughput rate are discussed in greater detail below. The alignment system AS is configured to capture the superimposed interference image 158 and transducer image 58 and measure the alignment of these images, as discussed below. The transducer image 58 is a DMD image when image transducer 150 includes or consists of a DMD.

The apparatus 10 also includes a controller CO that is operably connected to and is configured to control the operation of illuminator IL, image transducer 150, camera unit CU, alignment system AS, interference pattern generator IPG and substrate stage system SS. Details about these various apparatus components and their operation are provided below.

Example Direct-Write Lithography System

Figure 2A:
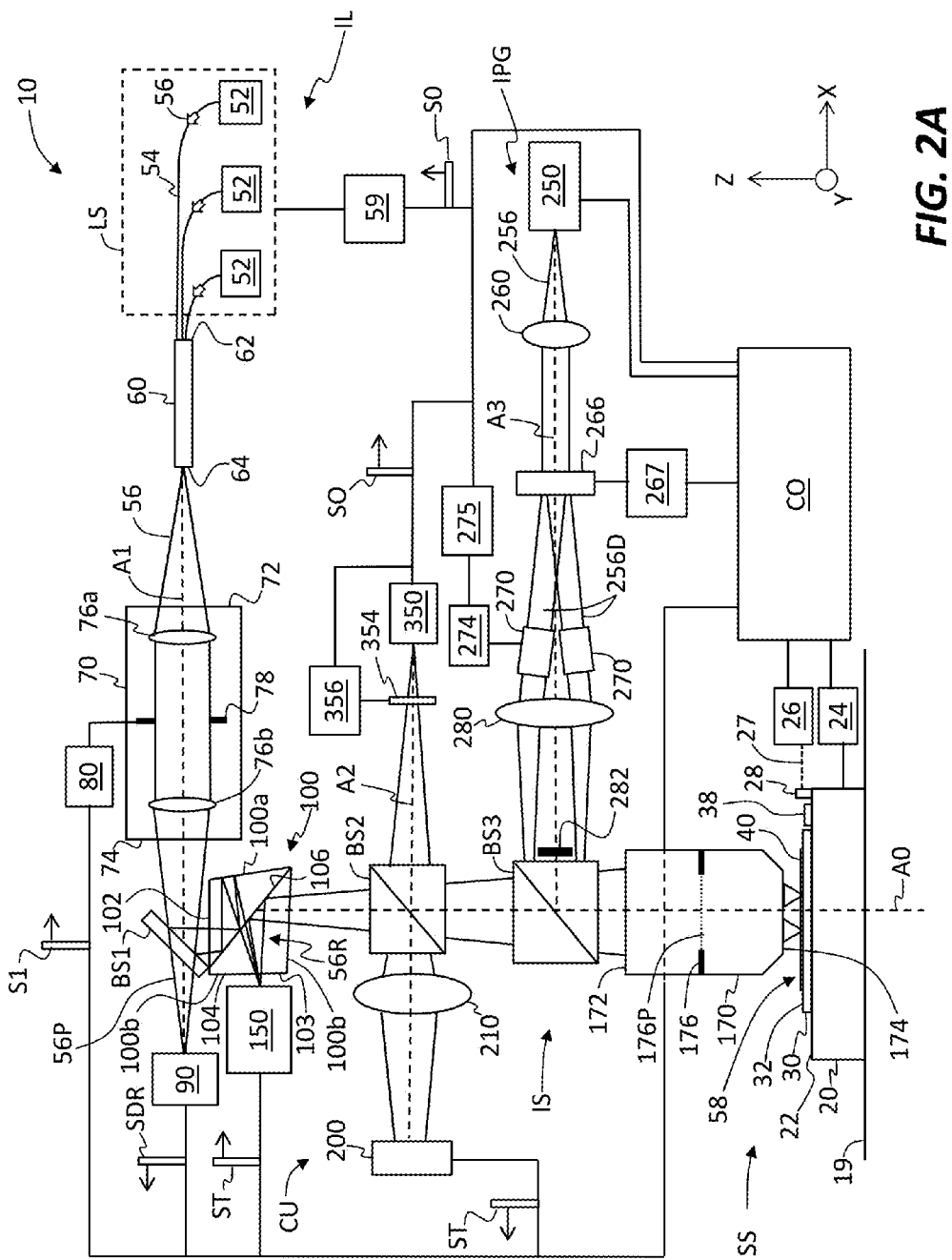
FIG. 2A is a more detailed schematic diagram of the direct-write lithography apparatus of FIG. 1.

FIG. 2A is a more detailed schematic diagram of the direct-write lithography apparatus 10 of FIG. 1. The apparatus 10 includes a stage 20 having an upper surface 22 configured to support substrate 30. The stage 20 is shown as being supported by a platen 19, and the stage may move over the platen by means of air bearings or a magnetic suspension system.

The substrate 30 can be a silicon wafer. The stage 20 can include a chuck (not shown) for supporting substrate 30. The stage 20 is operably connected to a stage driver 24 and a precision metrology system that monitors its position. The metrology system could be an interferometric positioning system 26 that measures the position of stage 20 using measurement light 27 reflected from a reflecting member 28 on the stage. The stage 20, stage driver 24 and interferometric positioning system 26 (including reflecting member 28) constitute a part of substrate stage system SS.

The apparatus 10 also includes, as part of illuminator IL, in order along a first axis A1, a light source LS, a light uniformizer 60 having input and output ends 62 and 64, a relay optical system 70 with input and output ends 72 and 74, a beam-splitting element ("beam splitter") BS1, and a reference detector 90. The light source LS includes a laser or one or more laser diodes 52 optically coupled to input end 62 of light uniformizer 60 via respective optical fiber sections 54. In an example, one or more laser diodes 52 generate the non-uniformized light 56 at wavelength $\lambda_1$, which in an example is 405 nm. In an example, light source LS is controlled by a light source controller 59 that is responsive to a light source control signal S0. The light 56 is also referred to as "light beam" 56 where appropriate, and is also referred to as non-uniformized or uniformized depending on its location along the optical path of apparatus 10.

An example light uniformizer 60 includes or consists of a light pipe having a cross-sectional shape similar to the shape of the image transducer 150. Such a light pipe can be hollow and have reflective walls or can be solid and operate by total internal reflection.

In an example, relay optical system 70 includes a collimating lens 76a and a focusing lens 76b, with an adjustable aperture 78 disposed between these lenses. The adjustable aperture 78 is operably connected to an aperture driver 80 configured to set the size of the aperture in response to a control signal 51. The aperture 78 controls the size of the collimated portion of light beam 56, which lies between collimating and focusing lenses 76a and 76b, and thereby adjusts the numerical aperture of relay optical system 70.

The beam splitter BS1 is configured to reflect most of light beam 56 exiting output end 74 of relay optical system 70. In an example, beam splitter BS1 directs light beam 56 such that the light beam proceeds at substantially a right angle to axis A1. The remaining portion of light beam 56, denoted as light beam 56P, travels through beam splitter BS1 and to reference detector 90. In response thereto, reference detector 90 generates a reference detector signal SDR, which is representative of the amount of detected optical power. The power detected by detector 90 is proportional to the power incident on the image transducer 150, so the power incident on the image transducer can be measured through a calibration technique.

A frustrated total-internal-reflection (FTIR) prism assembly ("prism assembly") 100 is disposed to receive the portion of light beam 56 that is reflected by beam splitter BS1, namely, light beam 56P. The FTIR prism assembly 100 includes first and second prism sections 100a and 100b that define an input surface 102, a device surface 103, an output surface 104, and an interface 106. The prism assembly 100 is discussed in greater detail below.

The light source LS, light uniformizer 60, relay optical system 70, beam splitter BS1, reference detector 90 and FTIR prism assembly 100 constitute illuminator IL, which provides the substantially uniform illumination light beam 56 to image transducer 150.

The image transducer 150 of apparatus 10 is operably disposed adjacent device surface 103 of prism assembly 100. A DMD-based image transducer 150 has the aforementioned array of micro-mirrors 152 (see FIG. 1), which can be turned on and off (e.g., by electrostatic deflection of the tilt angle) to create a select pattern in response to a transducer control signal ST. Thus, image transducer 150 is illuminated by uniformized light beam 56P exiting device surface 103 of prism assembly 100. The light 56R reflected by image transducer 150 is then reflected from interface 106 of prism assembly 100 and exits output surface 104 of the prism assembly to travel along primary axis A0. As mentioned above, DMD-based image transducer 150 has a large number of micro-mirrors 152, e.g., over 1 million, and in another example about 2 million. Larger numbers of micro-mirrors 152, up to the limits of the state of DMD technology, can also be employed.

The apparatus 10 includes along axis A0 an objective lens 170 operably arranged adjacent wafer 30 and wafer stage 20. The objective lens 170 has an input end 172 and an output end 174, and includes a pupil 176 that defines a pupil plane 176P. The objective lens 170 is color-corrected and is also telecentric. The objective lens 170 is configured to receive at input end 172 the reflected light 56R from image transducer 150 and to form an image of the transducer (i.e., the transducer image 58) in photoresist layer 40 on substrate 30, which resides adjacent output end 174 of the imaging lens.

The apparatus 10 includes second and third beam splitters BS2 and BS3 that reside along axis A0 between prism assembly 100 and objective lens 170 and that respectively define second and third axes A2 and A3. An imaging photodetector 200 lies along axis A2, along with an imaging lens 210. The imaging lens 210 is configured to receive reflected light 56R from second beam splitter BS2 and form a pupil image on photodetector 200, which corresponds to the image formed at the relay lens pupil.

The camera unit CU, which views the substrate 30, comprises an imaging photodetector 350. The pupil image on detector 200 allows the direction and intensity of the illumination reflected off of each micro-mirror 152 or any group of micro-mirrors to be measured. Thus if the hinge of a micro-mirror 152 breaks and the deflection is abnormal in any way, the problem can be identified and localized quickly. The camera unit CU can be used to determine the relative positions of the alignment targets on the substrate 30, the individual "on" pixels in the image transducer 150 and the positions of the orthogonal fringe patterns 160X and 160Y. The camera unit CU can be used to measure the amount of inhibition light in the bottom of each of a plurality of dark spots 300D. The measurements can be used to minimize the amount of inhibition light in each dark spot 300D and to make it as uniform as possible using adjustments provided for that purpose.

The apparatus 10 includes along third axis A3 at least one light source 250 that generates light 256 at the aforementioned wavelength $\lambda_2$. An example light source 250 is a laser diode. A collimating lens 260 collimates the light 256 from light source 250 and directs it through a phase grating 266 that diffracts light beam 256 to form two diffracted light beams 256D that travel in different directions. The phase grating 266 is operably connected to a driver 267 that finely adjusts the period of the phase grating, which is obtained by a slight rotation of the grating about an axis parallel to the lines on the grating and passing through the optical axis A3.

Figure 2B:
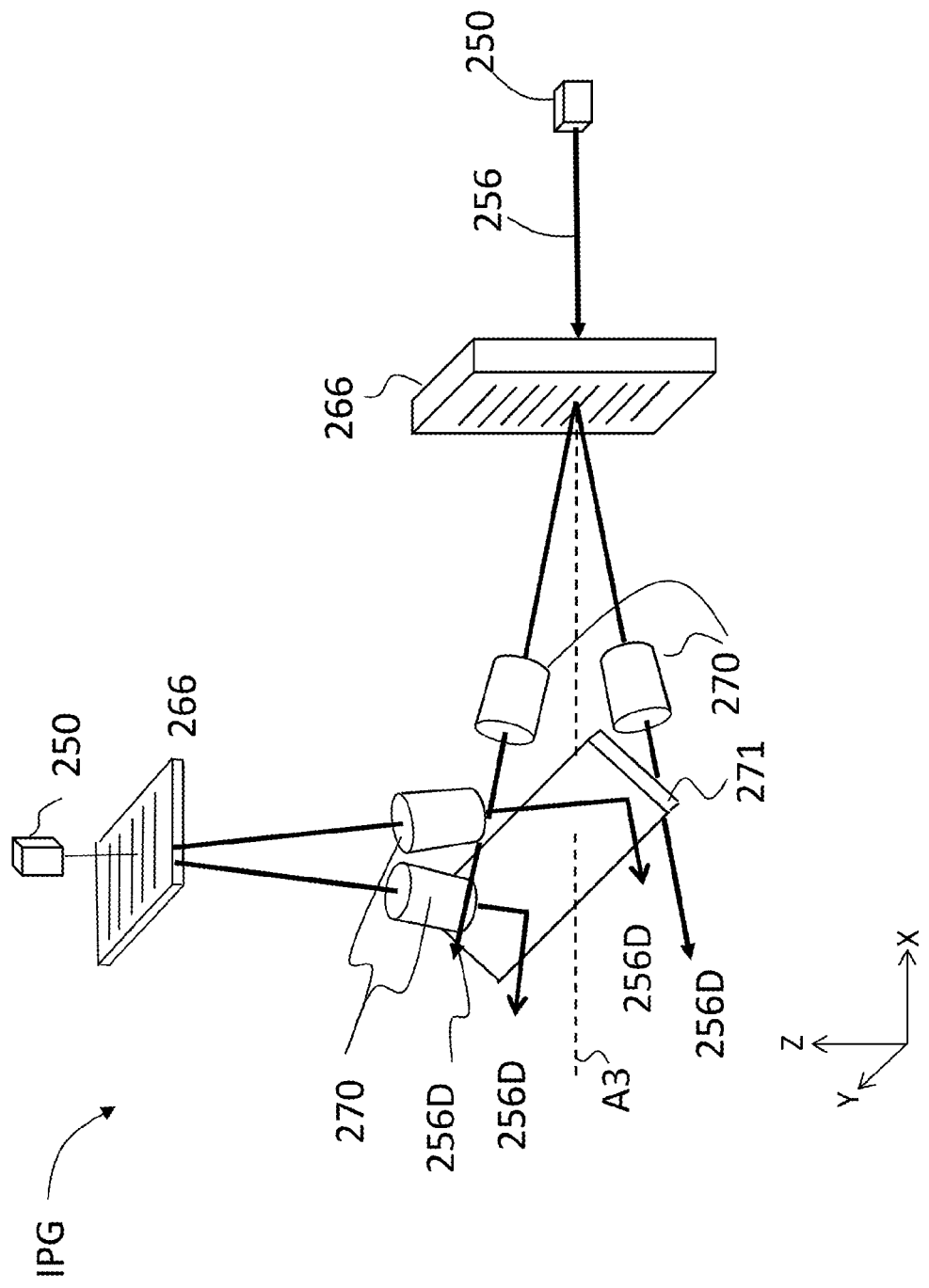
FIG. 2B is a close-up, elevated view of an example interference pattern generator showing two laser sources, two phase gratings and four phase shifters, along with four diffracted light beams.

Not shown in FIG. 2A is a second light source, collimating lens and grating, which generate a second set of diffracted light beams arranged on either side of the optical axis A3 and out of the plane of FIG. 2A. FIG. 2B is a close-up, elevated view of an example interference pattern generator IPG that shows all four diffracted light beams 256D, all four fringe shifters 270, two light sources 250 and two phase gratings 266. A fold mirror 271 is used to direct the two out-of-plane diffracted light beams 256D in the same general direction as the other two in-plane diffracted light beams.

The four diffracted light beams 256D pass through respective fringe shifters 270. Example fringe shifters 270 are Pockels cells, Kerr cells, and an arrangement containing an acousto-optic modulator. The fringe shifters 270 introduce a path-length change between the two coherently linked, interfering beams 256D, thereby causing the resultant fringe patterns 160X and 160Y to shift position normal to the fringe direction. Since the positions of the fringe patterns 160X and 160Y determine the position of the super-resolution pixels being written, the fringe shifters 270 provide a very quick and easy way to adjust the position of the pixels in order to compensate for the scanning motion of the stage 20 or any small errors in the stage position.

An imaging lens 280 then works in combination with beam splitter BS3 to focus each of the four diffracted light beams 256D in four symmetrically located positions around the edge of the pupil 176 of the objective lens 170. After passing through the objective lens 170, each of the four diffracted light beams 256D is collimated. The collimated diffracted light beams 256D overlap on the image plane to form the X and Y grid interference image 158 in photoresist 40. The fringe shifters 270 are operably connected to a driver unit 274, which in turn is connected to a control unit 275 that synchronizes the fringe positions with the position of the stage 20 during the exposure. A zero-order light-blocking member 282 is arranged along axis A3 and adjacent beam splitter BS3 so that only light from the four ±1st order diffracted light beams 256D passes through to the beam splitter and through objective lens 170.

With reference to FIG. 3, the net result of imaging the four diffracted light beams 256D in the objective focal plane is a robust interference image 158 of equal lines and spaces that stretches across the field of the objective lens in the X- and Y-directions, thereby by forming the X-Y grid. The spacing between the fringes in patterns 160X and 160Y is set equal to the spacing between the pixels of image transducer 150 imaged on the substrate 30. The brightest parts of the fringes are aligned with the boundaries between the rows and columns of the pixels of image transducer 150. The darkest parts of the fringes overlap in the center of each pixel of image transducer 150, thus forming the aforementioned dark spots 300D, which, if filled with exposure radiation $\lambda_1$, each form a super-resolution photoresist pixel 40P (see FIG. 6).

At some distance away from the center of each dark spot 300D, the intensity of the inhibition radiation forming the interference image 158 increases to the point where it nulls the exposure radiation and thereby limits the size of each of the super-resolution pixels 40P. Here, the term "spot" means a hole or sharp localized drop in the intensity. In an example, the distribution of the intensity in the dark spots 300D serves to trim the size of the exposure spots, resulting in a pixel dimension $L_D$ (see FIG. 3). Ideally, dark spots 300D have a parabolic shape, with the center of each dark spot having zero intensity. This shape serves to trim the diffraction-limited image of a corresponding pixel of image transducer 150 into an inverted parabolic shape.

The dark spots 300D each have a very large depth of field, since they exist everywhere the interfering diffracted light beams 256D overlap. The photoresist 40 is configured so that inhibition light of second wavelength $\lambda_2$ serves to inhibit the exposure of the photoresist, while exposure light of first wavelength $\lambda_1$ serves to expose the photoresist. Thus, if the photoresist 40 is irradiated with inhibition light of second wavelength $\lambda_2$ in all but the very small regions, such as those defined by dark spots 300D, then the only place the exposure light 56 can expose photoresist is in the regions defined by the dark spots.

Generally speaking, a bright spot 300B is larger in size than a dark spot 300D is. The size of the image defined by dark spots 300D depends on the dose of exposure radiation received, and on the ratio between the intensity of the inhibition light and the intensity of the exposure light 56. The higher the intensity ratio, the smaller the size of the resultant super-resolution pixel 40P. The size of the pixel 40P also depends on the characteristics of photoresist 40. Some photoresists 40 are more sensitive than others, and the effectiveness of the inhibition radiation is likely to vary somewhat from one photoresist composition to another. The wavelengths used for exposure and inhibition also affect the resolution. However, the exposure inhibition created by each of dark spots 300D generally causes the resulting photoresist pixel 40P to be smaller in size than would be the case were the photoresist pixel formed by the bright spot 300B only, i.e., in the absence of the exposure-inhibiting dark spot.

Since a DMD can be precisely fabricated, light in the transducer image 58 can be directed exactly to the location of select dark spots 300D to form a desired photoresist pattern in photoresist 40. The angle of each of the DMD micro-mirrors 152 determines the position of the illumination beam 56 in the objective pupil 176, and given that the illumination beam is usually smaller than the pupil, great precision in the micro-mirror tilt angle is not required. In the specific example given here, however, the 1° variation in the angle of the micro-mirrors 152 makes it impractical to employ an illumination beam that is smaller than the pupil 176, and it is therefore necessary to overfill the pupil with the illumination beam 56 to achieve good illumination uniformity across the transducer image 58.

FIG. 4 is a simulated transducer image 58 that shows a portion of the pixel pattern generated by an image transducer 150 assuming that every other pixel 40P is turned off in a checkerboard pattern. In this case the illumination is assumed to be highly spatially coherent ($\sigma=0$). The bright white spots 300B reside directly at the location of interference pattern dark spots 300D and where the pixels 40P are turned on. The patterned photoresist layer 40 and substrate 30 are then processed using standard photolithography techniques to form sub-resolution lithography features in the substrate.

Objective Lens

Commercially available objective lenses for use as objective lens 170 are often corrected for infinity. Consequently, in an example of imaging system IS as shown in FIG. 5, a first compensating lens CL1 is arranged along optical axis A0 to yield a back focal plane with a finite conjugate distance. It is often also convenient to have the back focal plane be telecentric like the object plane. This can be achieved with a second compensating lens CL2 placed between the frustrated prism 100 and second beam splitter BS2. This requires that illuminator IL be telecentric both at image transducer 150 and in the object space near light uniformizer 60. Thus, in an example, imaging system IS consists of objective lens 170 and beam splitters BS2 and BS3, as well as a prism section 100*b* (see FIG. 2A) of frustrated prism assembly 100, while in another example, the imaging system also consists of one or both of compensating lenses CL1 and CL2.

X-Y Grid Interference Image

The beam splitter BS3 allows the four diffracted light beams 256D to be focused onto the pupil plane 176P of objective lens 170, and then pass through the objective lens to form four collimated beams covering the field of the objective at substrate surface 32 (or photoresist layer 40 thereon) to define interference image 158, such as is illustrated in FIG. 3. All four diffracted light beams 256D may be generated by the same laser diode 250, provided care is taken to ensure that there is no possibility of interference between the two orthogonal interference fringe patterns 160X and 160Y. However, in another example as illustrated in FIG. 2B, to prevent interference effects between the two orthogonal interference fringe patterns 160X and 160Y, separate laser diodes 250 are used so that diffracted light beams 256D in the Y-plane are generated from one laser diode and diffracted light beams in the X-plane are generated by another laser diode.

The two beams of an opposing pair of diffracted light beams 256D are coherently linked so that they interfere to generate fringe patterns 160X and 160Y. However, interference between the two crossed fringe patterns 160X and 160Y is not desirable. Such interference can be avoided by polarizing the light used to generate one set of diffracted light beams 256D at a right angle to the light used to generate the other set of diffracted light beams. This ensures that the X-direction fringe pattern 160X and the Y-direction fringe pattern 160Y do not interfere with each other, and that the light intensity of a single fringe pattern is well described by a sine-squared function. Where the centers of fringe patterns 160X and 160Y overlap, the light intensity is twice as high as where the center of one fringe pattern falls on the trough of another.

The diffracted light beams 256D are also referred to herein as inhibition light beams because they serve to inhibit the exposure of photoresist layer 40 by the transducer image 58. Thus, two of the inhibition light beams 256D are propagated in the X-Z plane and two are propagated in the Y-Z plane.

The phase grating 266 generates ±1st order diffracted/inhibition light beams 256D, which diverge before striking imaging lens 280. The imaging lens 280 serves to focus the inhibition light beams 256D onto the pupil plane 176P of objective lens 170. The beam splitter BS3 is a spectrally selective beam splitter so that it can reflect the second wavelength $\lambda_2$ generated by the one or more laser diodes 250. The light-blocking member 282 blocks zero-order light 256D-0 (see FIG. 21) from phase grating 266, which, if unblocked, could generate a uniform level of inhibiting radiation that would null a comparable amount of exposure radiation. The third beam splitter BS3 efficiently reflects the inhibition wavelength $\lambda_2$ used to form the X-Y grid interference image 158 (see FIG. 3) and efficiently transmits the exposure wavelength $\lambda_1$ of reflected light 56R that forms the transducer image 58.

In an example embodiment, two diffracted light beams 256D can be generated using a 50:50 beam splitter if light source 250 is sufficiently monochromatic. The advantage of using a grating such as phase grating 266 (a reflection grating can also be used) is that the intensities of the two diffracted orders are usually very nearly equal and the geometry favors short symmetrical path lengths for each diffracted light beam 256D. The most efficient method is to employ the phase grating 266, since doing so minimizes the generation of any zero-order light 256D-0 and efficiently generates the ±1st order lights.

The diffracted light beams 256D having equal intensities is advantageous since only equal intensities yield perfectly dark spots (black holes) 300D.

While two pairs of diffracted light beams 256D are shown by way of illustration, three pairs of diffracted light beams 256D can also be used. More generally, two or three pairs of beams 256D can be employed, wherein the two or three beam pairs are symmetrically arranged to generate interference image 158.

Introducing an Exposure Threshold

In some cases, it may prove desirable to introduce a small, uniform amount of inhibition light 256D into each hole 300D to serve as a threshold that prevents low levels of illumination (exposure) light 56 from the surrounding pixels 40P from creating a partial exposure. This can conveniently be achieved by introducing a slight imbalance between the intensities of diffracted light beams 256D.

There are a number of ways to introduce this slight imbalance. One way includes attenuating one of the diffracted light beams 256D more than another using, for example, a selective attenuator arranged in one of the diffracted light beams. Introducing a window into the region before the acousto-optical modulators and where the two diffracted light beams 256D are cleanly separated allows the portion of the window used by one beam to be coated with efficient antireflective coatings and the portion of the window used by the other beam to have less efficient coatings.

The Transducer Image

The image transducer 150 is illuminated by uniformized light 56 using illuminator IL, as described above. The prism assembly 100 consists of the aforementioned two prism sections 100a and 100b separated by a small air gap that defines interface 106. The light 56 can pass through the gap when it is incident at the gap at near normal angles but is reflected when incident at angles near 45°.

Thus, light 56 incident on image transducer 150 at 24° to the normal readily passes through prism assembly 100. But reflected light 56R from micro-mirror 152 tilted at +12° hits the air interface 106 of the prism assembly 100 at 45° and is totally reflected down primary axis A0 toward objective lens 170. If the micro-mirror 152 is tilted at −12°, the only other option with a digital mirror, then the incident light 56 is reflected at an angle of 48° to the normal and is lost from the optical path.

The image transducer 150 thus defines an exposure radiation pattern (i.e., the transducer image 58) that is superimposed on the two-dimensional X-Y inhibition interference image 158 in photoresist layer 40 on substrate 30. Ideally, during exposure the superposition is such that each of a plurality of exposure pixels 58P (i.e., light from a given micro-mirror 152) is centered on one dark spot 300D. The net result is that where an exposure pixel 58P is present, a very small photoresist pixel 40P is created in photoresist layer 40 at the corresponding location. Where the exposure by interference image 158 causes photoresist 40 to be insensitive to activation by exposure light 56 of wavelength $\lambda_1$, the photoresist pixel 40P is surrounded by inhibited resist 40I. The dimension (size) $L_P$ of the photoresist pixel 40P depends on the dose of exposure light 56R (FIG. 1) that forms the transducer image 58 and the intensity of the surrounding inhibition fringe patterns 160X and 160Y of interference image 158 that inhibits the exposure. In an example, the resultant photoresist pixel 40P can have a size $L_P$ that is ½₀th the size of the de-magnified pixel on image transducer 150, i.e., $L_P=(0.05) \cdot L_M/M$, where $L_M$ is the corresponding dimension of DMD micro-mirror 152 and M is the magnification ratio from the substrate 30 to the image transducer.

FIG. 6 shows an example of the diffraction-limited image of a single DMD pixel illuminated with 405-nm radiation (solid line) and the surrounding interference pattern generated with 532-nm radiation that follows a sine-squared function. Assuming that one watt of 532-nm radiation exactly cancels a similar intensity of 405-nm radiation, the resulting intensity distribution is given approximately by the dotted line in FIG. 6. Note that the resultant pixel profile represented by the dotted line is much narrower than the diffraction limited pixels represented by the solid line. Increasing the interference intensity serves to make the width of the narrowed pixel even narrower.

Stage Position Compensation for Overlay

An advantage of apparatus 10 is that it is not necessary to control the position of stage 20 to a small fraction of the size $L_P$ of super-resolution pixel 40P to achieve good overlay performance between the current pattern and previously created patterns on the substrate 30. In an example, the size $L_M$ of micro-mirror 152 can be about 10.6 microns, and the magnification provided by objective lens 170 can be about 36.6. This yields a pixel image size on the substrate 30 (i.e., a photoresist pixel 40P size) of $L'_M$ (see FIG. 4)=$L_P$ (see FIG. 6)=0.29 microns, where $L'_M$ is the size of an image pixel 58P in transducer image 58. Trimming this by a factor of 18 by forming bright spot 300B over dark spot 300D yields a pixel size of $L_P$=16 nm. The required overlay for this geometry might be 3 nm Accurately positioning stage 20 in the presence of vibration and other influences to this accuracy can be difficult, because the bandwidth of the associated control system of substrate stage system SS is typically less than 100 Hz and because there are disturbances with higher frequency content.

The shortcomings of the positioning ability of substrate stage system SS, provided they are reasonably small, can be corrected by the aforementioned fringe shifters 270. The fringe shifters 270 are placed in each diffracted light beam 256D that generates the inhibition fringe patterns 160X and 160Y. Any increase or decrease in the path of the diffracted light beams 256D causes the fringes in interference image 158 to shift. Example fringe shifters 270 include Pockels cells, and Kerr cells, piezo-optic devices and acoustic modulators. Acoustic modulators (also called acousto-optic modulators) operate by reflecting light off of a moving sound wave in a transparent material. The sound wave might have a frequency on the order of 100 MHz, and the bandwidth of any of these devices might on the order of 100+kHz or more.

The total range of the (phase) shift provided by the fringe shifters 270 need only be about one wavelength, roughly the distance between neighboring image pixels, since they need only operate during the time of the exposure. During this time frame, interference image 158 can be held stationary or moved in any direction on a continuous basis. Providing the stage position errors are small with respect to the size $L'_M \approx 0.295$ microns of a single exposure pixel 58P, the residual error can be corrected by moving the location of dark spots 300D with fringe shifters 270. In practice, the fringe pattern of interference image 158 can be locked into position on substrate 30 so it moves with the substrate during exposure. The positioning stability of the super-resolution lithography system is thus determined by the bandwidth of the fringe shifters 270 and not by the bandwidth of substrate stage system SS.

The Alignment and Intensity Monitoring System

With reference to FIGS. 1 and 2A, an example alignment system AS employs the picture from camera unit CU. The alignment system AS includes a digital camera 350, which views substrate 30 via second beam splitter BS2 and captures a digital image of the superimposed interference pattern and transducer images 158 and 58 as well the images of patterns previously placed on the substrate 30. The digital image of the superimposed interference pattern, transducer and previous images are embodied in an overlay signal S0, which is used to recognize and determine the positions of alignment targets 34 (see FIG. 6) contained in the layers created previously on substrate 30 with respect to the superimposed interference pattern and transducer images 158 and 58.

A filter changer 356 that inserts different filters 354 in front of digital camera 350 is used to permit the digital camera to image over different wavelengths or wavelength bands so as to get an optimum image of the alignment targets 34 on the substrate 30. In an example, different filters 354 that shape the spectrum to enhance the appearance of the various image components are used. The filter changer 356 is operably connected to controller CO. The apparatus 10 performs alignment between the previous patterns formed on the substrate 30 and the new pattern to be formed on the substrate using the transducer image 58 and the interference image 158.

The digital camera 350 can also be used to measure the relative intensities of the interference light 256 used to create interference image 158 and the exposure light 56 used to illuminate image transducer 150. To make an absolute intensity measurement, the reflectance of substrate 30 has to be accurately known. This is achieved by employing a reflective element 38 on substrate stage top surface 22. The reflective element 38 has a known reflectivity-versus-wavelength characteristic and in an example lies in the same plane as substrate top surface 32.

To achieve an accurate overlay between an existing pattern on the substrate 30 and the next pattern, the optical path from digital camera 350 to the substrate has to be very well corrected. In an example, digital camera 350 includes more than four image-sensing pixels for every exposure pixel 58P in transducer image 58. The second beam splitter BS2 can be spectrally neutral and need only reflect a tiny portion of light 56 passing through it.

Distortion Correction

In many instances, photoresist patterns formed in photoresist layer 40 on substrate 30 need to be accurately overlaid with existing patterns that have been previously formed in a photoresist layer or in the substrate surface.

However, photoresist patterns are not always geometrically perfect. The compressive and tensile layers added to the substrate 30 combined with an anisotropic circuit pattern can cause the substrate to distort; in addition, the mask pattern and the optical system that defined the previous pattern may not have been perfect to start with.

To achieve a very tight overlay between an existing substrate pattern and a follow-on pattern, it is often necessary to map the location of a number of chips or even a few locations within each chip and then distort the pattern to be overlaid so that it best fits the underlying pattern. One of the advantages of apparatus 10 is that it affords great flexibility in adjusting the shape and position of the interference pattern and transducer images 158 and 58. By adding a small correction to the desired stage position as a function of the stage position, it is possible to distort the particular pattern being overlaid so that it accurately conforms to the underlying (existing) patterns.

The Metered Stage

Commercially available substrate stages do not have the metrology accuracy required for state-of-the-art lithography. Laser gauging via interferometric positioning system 26 and reflecting member 28 provides sub-nanometer resolution, as long as the air path through which measurement light (laser beam) 27 travels can be made sufficiently thermally stable. In most industrial environments, the accuracy is about 20 nm.

An example aspect of apparatus 10 employs a two-dimensional reference grid (not shown) on a thermally inert substrate 30 that is positioned at the substrate focal plane level, and outboard of any substrate location. The reference grid is read by transducers located on stage 20. A grid consisting of 0.5-micron lines and spaces can be interpolated to about 1 part in 500, yielding a resolution of about 1 nm.

Inhibition Fringe Scale and Rotation Adjustment

The alignment of interference image 158 with transducer image 58 may require an adjustment of the scale or magnification of the interference pattern. This can be achieved by designing interference pattern generator IPG so that interference image 158 is slightly larger than required, and then tilting the phase grating 266 (with respect to primary optical axis A0) to slightly reduce the image size. In this case, the scale varies as the cosine of the angle between the grating normal and the optical axis A0. This adjustment can be carried out automatically using electrical actuators to rotate each phase grating 266 about a line parallel to the grating lines and through the grating center. The angular orientation of the fringe patterns 160X and 160Y can be adjusted by rotating the phase grating 266 about the optical axis A0.

In another example, light source 250, collimating lens 260 and phase grating 266 are configured to focus each of the ±1 order beams 256D into optical fibers, which are brought into the objective assembly and relayed to the pupil plane 176P using a small relay lens (not shown). By adjusting the position of the small relay lens, the emission end of the optical fiber, or some intermediate element, the period of interference image 158 can be changed and the image rotated.

Variable Resolution

The apparatus 10 is configured to provide a variable degree of resolution. Lower-resolution imaging can be performed more quickly than higher-resolution imaging so that the appropriate amount of resolution can be applied for the given pattern to be formed. For example, a pattern requiring a pixel size of 40 nm could be done about four times faster than a pattern requiring a pixel size of 20 nm.

To change the resolution of apparatus 10, in an example the intensity of light 256 from laser source 250 is changed, which changes the intensity in interference image 158 and the pixel dimension $L_D$ created by dark spots 300D. A different pixel dimension $L_D$ requires a different rasterized database, as well as a different scan trajectory and scanning speed. It is noted here that dark spots 300D do not have a definite size. They are defined by a substantially parabolic intensity distribution so that the super-resolution photoresist pixel 40P is determined by the ratio of the exposure intensity to the inhibition intensity.

Thermal Compensation

On a nanometer scale, thermal effects on the imaging process need to be controlled since at such small scales thermal stability is difficult to achieve. Small temperature differences in the air path between the diffracted light beams 256D used to produce interference image 158 can cause motions in the fringe position. Small thermal changes in objective lens 170 and the components in interference pattern generator IPG can slowly change the alignment between transducer image 58 and interference image 158. It is therefore desirable to have a position reference standard and to constantly position the other critical items in relation to the standard. For example, the position of image transducer 150 as seen by digital camera 350 can be selected as the position reference standard, and the expected position of interference image 158, taking into account correction for stage position error, can be compared to the actual position to generate a correction signal. When applied to the fringe shifters 270, this signal can correct for short-term air path thermal fluctuations as well as longer-term thermal changes in apparatus 10.

Data Transfer

In most configurations of apparatus 10, image transducer 150 is most likely to be the gate for data transfer. For example, the Texas Instruments 1080p DMD has a maximum frame rate of 20,000 frames per second, which corresponds to a data rate of 41.5 Gb/s. With a 64- or a 128-bit wide bus, this frame rate is not a problem for most applications. However, for apparatus 10 to achieve a throughput comparable to modern DUV scanners, the data rate needs to be higher, e.g., 12 Tb/s, or about 290 times the data rate of a typical DMD.

Figure 7:
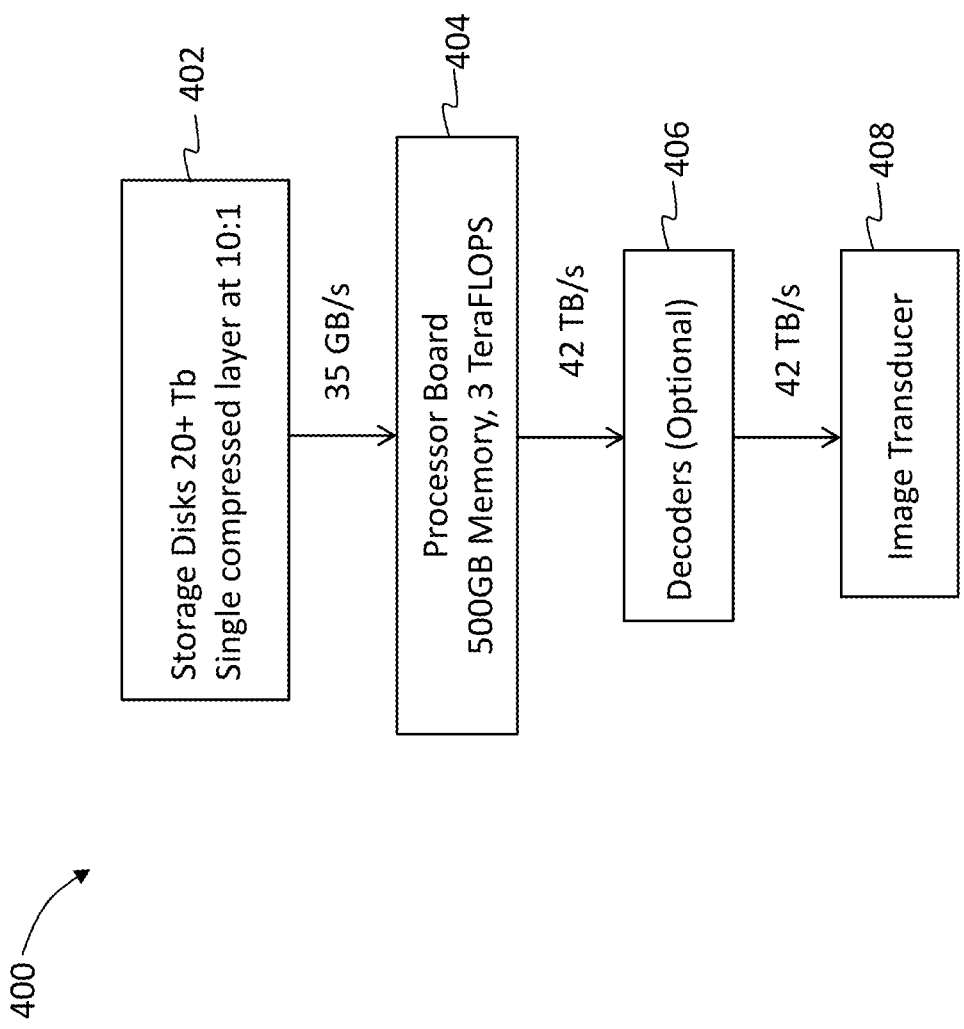
FIG. 7 is a flow diagram that illustrates an example embodiment of a method of achieving a sufficiently high data transfer rate for the direct-write lithography apparatus to have a reasonable throughput.

FIG. 7 is a flow diagram that illustrates an example embodiment of a data transfer method 400 of achieving a data transfer rate high enough for apparatus 10 to achieve a reasonable throughput. With reference to a step 402, apparatus 10 starts with rasterized, flattened layouts of a chip to be formed using wafer 30. The layouts are stored in a mass storage system MSM, which is shown in FIG. 1 by way of example and for ease of illustration as being part of controller CO. With reference to a step 404, the compressed layouts of step 402 are then transferred to the processor board, which has enough memory to store one layer at a time, e.g., 2 Tb of memory and a processing capability of 3 TeraFLOPS or more.

An example data rate for this particular transfer is about 35 Gb/s. With reference now to steps 406 and 408, the processor board then transfers the compressed layout to the image transducer 150 at a data rate of about 42 Tb/s. The image transducer 150 contains a large number of decoders and writing elements. The output of the decoders is uncompressed layout data, which is fed to the writing elements. The data transfer method 400 of FIG. 7 benefits from employing efficient and lossless compression and decompression algorithms as well as error checking.

To achieve a 12 Tb/s data rate or the even higher data rate of 42 Tb/s proposed for the extension to this technology, method 400 can be carried out using current super-computer technology, which has achieved computing speeds as high as 3 or 6 TeraFLOPS. This computing capacity can also support very high data rates, such as the aforementioned 42 Tb/s. The extra computing power, made available only recently, may obviate the need for the decoders, making it possible to transfer data directly from the processor board to the image transducer 150 without passing through decoder step 406 in method 400.

Illumination Uniformity and Exposure Dose Control

An image of the objective exit pupil 176 placed on photodetector 200 can be used to determine either the average exposure dose by turning on all the image-transducer pixels (i.e., micro-mirrors 152) or the variation in dose by turning on small groups of pixels progressively across the field. Variations in the tilt angle of the image-transducer micro-mirrors 152 can be measured by closing down aperture 78 in relay optical system 70, and then measuring the image pupil position on imaging photodetector 200. Measurement of the position of the center of the illumination patch on a pixel-by-pixel basis yields the total variation in the mirror tilt angle across the DMD micro-mirror array.

Controller

The controller CO is operably connected to all the electrically controlled devices and components in apparatus 10. The controller CO includes a display and a keyboard that serve as an operator interface. The mass storage system MSM is used for storing pattern information to be used by image transducer 150.

In one embodiment, controller CO includes a device, for example, a floppy disk drive, CD-ROM drive, DVD drive, magnetic optical disk (MOD) device (not shown) or any other digital device including a network connecting device such as an Ethernet device or an optical fiber-based network (not shown) for reading instructions and/or data from a computer-readable medium, such as a CD-ROM, a DVD, a MOD or any other digital source such as a network or the Internet, as well as yet-to-be-developed digital means. In another embodiment, controller CO executes instructions stored in firmware or software in a processor or a memory.

In an example, controller CO is configured (e.g., programmed) to perform the functions described herein, and as used herein. The controller CO may include one or more computers, processors, microcontrollers, microcomputers, programmable logic controllers, application-specific integrated circuits, other programmable circuits and the like.

Software may be used to implement or to aid in performing the disclosed concepts. Software functionalities of a computer system involving programming, including executable code, may be used to implement the methods disclosed herein. The software may be code that is executable by controller CO. In operation, the code and possibly the associated data records are stored within the computer and control system or stored externally. Hence, the embodiments discussed herein may involve one or more software products in the form of one or more modules of code carried by at least one machine-readable medium.

As used herein, a machine-readable medium refers to any medium that participates in providing instructions to a processor for execution. Such a medium may take many forms, including, but not limited to, non-volatile media, volatile media and transmission media. Non-volatile media include, for example, optical or magnetic disks, such as any of the storage devices in any computer(s) operating as one of the server platforms discussed above. Volatile media include dynamic memory, such as the main memory of such a computer platform. Physical transmission media include coaxial cables, copper wire and fiber optics, including the wires that comprise a bus within a computer system. Carrier-wave transmission media can take the form of electric or electromagnetic signals or of acoustic or light waves such as those generated during radio frequency (RF) and infrared (IR) data communications.

Common forms of computer-readable media therefore include, for example: a floppy disk, a flexible disk, a hard disk, magnetic tape and any other magnetic medium; a CD-ROM, a DVD and any other optical medium; less commonly used media such as punch cards, paper tape and any other physical medium with patterns of holes; a RAM, a PROM, an EPROM, a FLASH-EPROM and any other memory chip or cartridge; a carrier-wave transporting data or instructions; cables or links transporting such a carrier wave; or any other medium from which a computer can read programming code and/or data. Many of these forms of computer readable media may be involved in carrying one or more sequences of one or more instructions to a processor for execution.

The controller CO may be configured (e.g., via hardware, software, or a combination of both) to provide enhanced data transfer, data compression and processing techniques known in the art to facilitate the handling and processing of large amounts of data. Examples of such systems and methods are disclosed in U.S. Pat. No. 7,590,996, entitled "Data Path for High Performance Pattern Generator," and in Cramer et al., "Lossless compression algorithm for REBL direct-write E-beam lithography system," Alternative Lithographic Technologies II, edited by Daniel J. C. Herr, Proceedings of the SPIE, Vol. 7637, pp. 76371L, Apr. 2, 2010, which patent and which article are incorporated by reference herein.

EXAMPLE

An example apparatus 10 has a DMD-based image transducer 150 with micro-mirrors 152 as pixels having a center-to-center spacing SC of 10.8 microns, an inhibition wavelength $\lambda_2=532$ nm, and a numerical aperture NA=0.9 for objective lens 170. The spacing SF of fringes 160X and 160Y at substrate 30 is given by:

$$SF=\lambda/2NA=(0.532 \text{ microns})/(2\times 0.9)=0.2956 \text{ microns}$$

The inhibition fringe spacing SF is equal to the DMD pixel size L'M=LM/M, where M is the de-magnification of objective lens 170. Thus, $$L'_M=(10.8 \text{ microns})/M=0.2956 \text{ microns}$$

The magnification ratio M is therefore:

$$M=10.8/0.2956=36.541$$

Assuming the resolution R is 1/20 of the substrate pixel size, which is commensurate with experimental results, the minimum feature size $L_P$ that can be imaged is given by:

$$L_P=(0.2956 \text{ microns})/20=14.8 \text{ nm}.$$

Optical Modelling

FIG. 3 shows a small segment of the crossed-fringe interference image 158 as formed at substrate 30 or in photoresist 40 deposited thereupon. The regular pattern of dark spots 300D is clearly visible. FIG. 4 shows a small segment of the transducer image 58 where every other DMD micro-mirror 152 is turned "off" to create the checkerboard effect.

Figure 8:
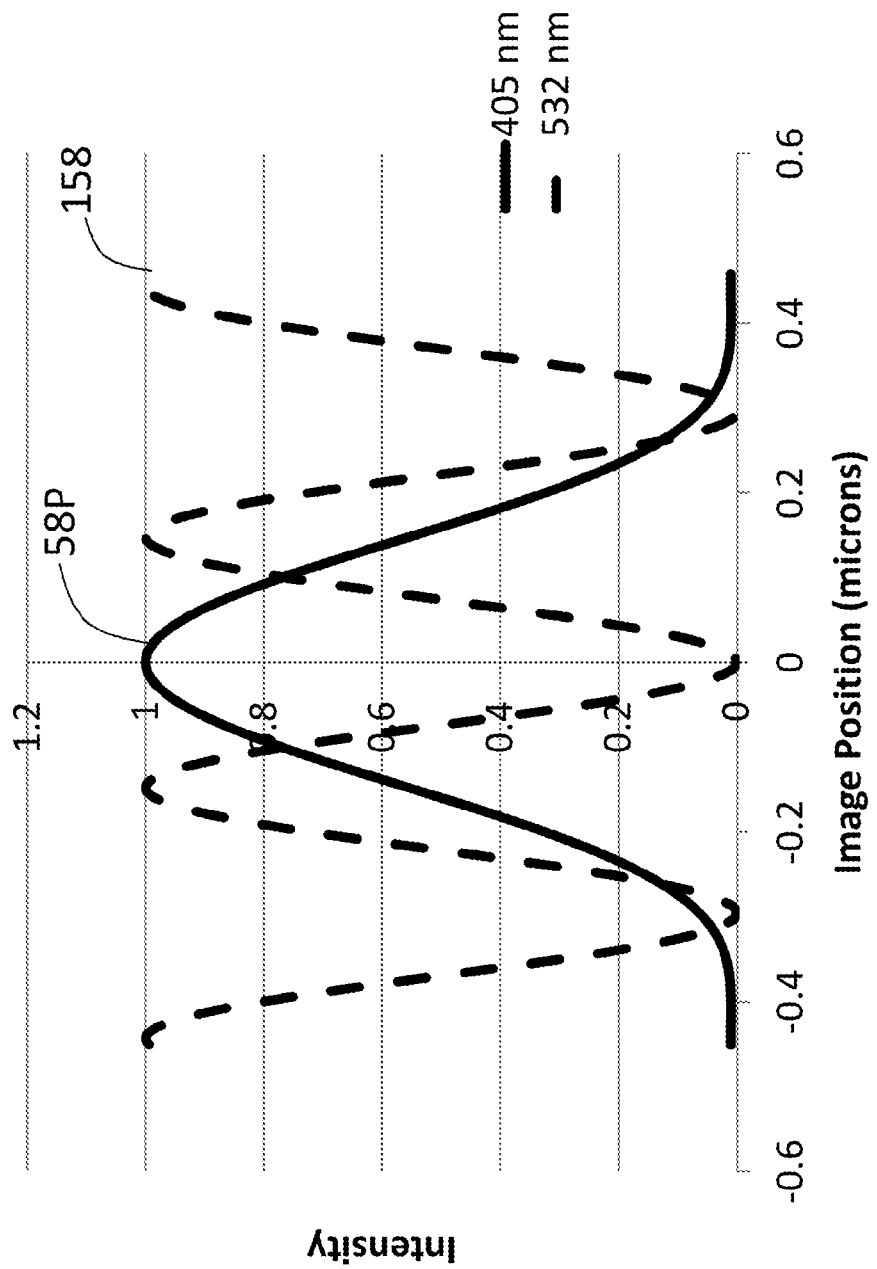
FIG. 8 is a plot of image position (microns) versus intensity (normalized) showing a cross-section in the X- or Y-direction through the middle of one pixel of the transducer image.

FIG. 8 is a plot of image position (microns) versus intensity (normalized) showing a cross-section in the X- or Y-direction through the middle of one pixel 58P of transducer image 58. The plot of FIG. 8 shows the intensity profile of a 405-nm "on" pixel (micro-mirror 152) illuminated incoherently ($\sigma=\infty$) and the inhibition fringes of interference image 158 centered on the pixel edges on either side. The width of a demagnified DMD pixel is $L'_M=0.295$ microns, which is also the distance from the center of one interference fringe to another. Note that at the center of the next pixel 58P the exposure illumination intensity from the first pixel has fallen to about 6.3%.

Figure 9:
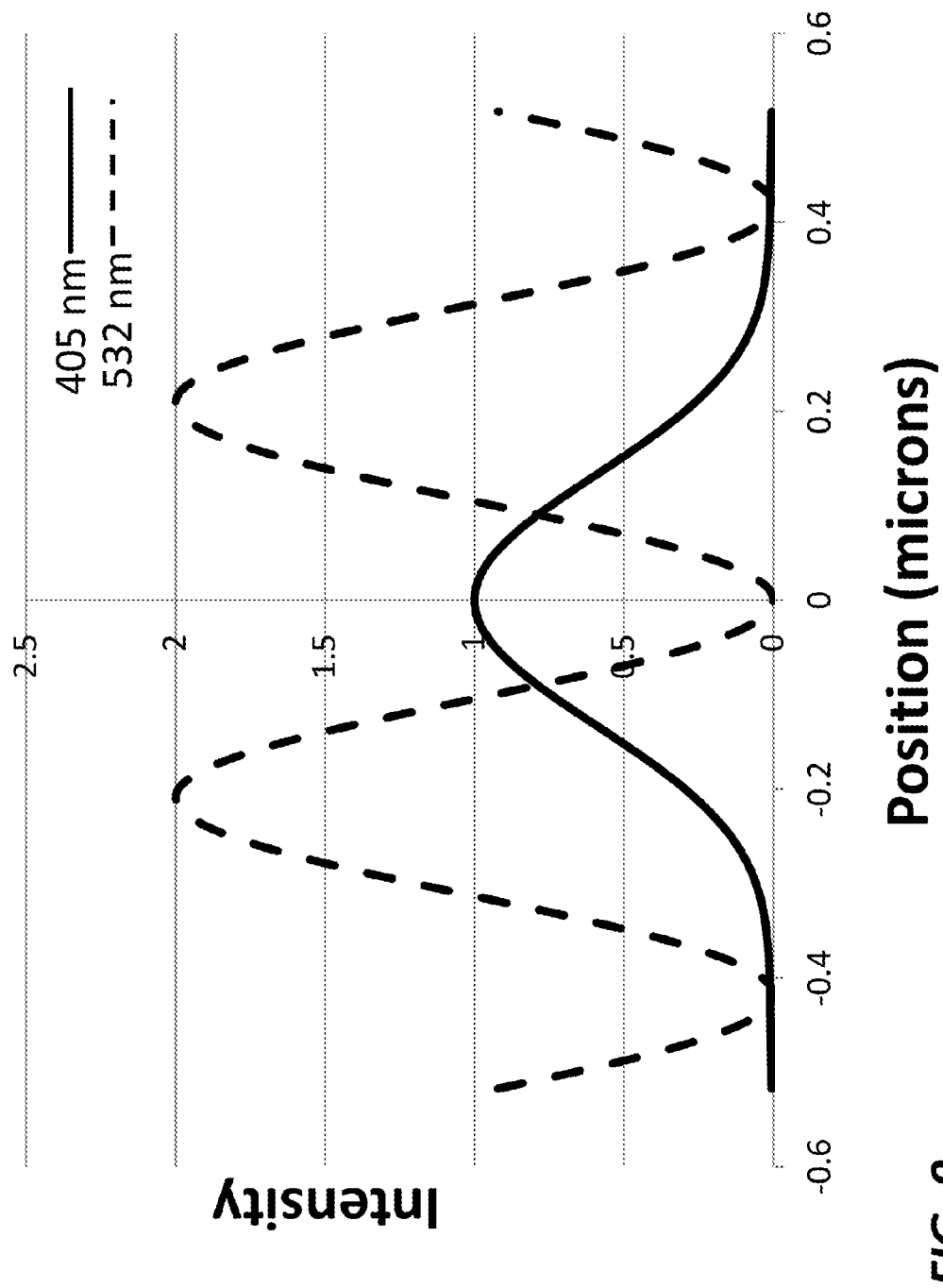
FIG. 9 is a plot of position (microns) versus intensity (relative units) for a portion of the interference image (dashed line) at second wavelength $\lambda_2$=532 nm and a portion of the transducer image (solid line) at first wavelength $\lambda_1$=405 nm showing how diagonally adjacent pixels also make a contribution to the overall intensity distribution.

FIG. 9 is a plot of position (microns) versus intensity (relative units) for a portion of the interference image 158 (dashed line) at second wavelength $\lambda_2=532$ nm and of the transducer image 58 (solid line) at first wavelength $\lambda_1=405$ nm. The plot of FIG. 9 illustrates how diagonally adjacent pixels 58P also make a contribution. In this case, the contribution from the nearest diagonal pixel 58P amounts to only 1.0% and for the four nearest diagonal pixels 58P combined amounts to 4%. Thus the total contribution from the four adjacent pixels 58P and the closest diagonal pixels totals about 29%. Depending on the nature of the resist (high or low contrast) and the expected performance of the lithography system, a 29% worst-case contribution from adjacent pixels 58P may or may not be acceptable.

The regions most susceptible to scattered or diffracted light from an "on" pixel 152 are the dark spots 300D centered on the nearby "off" pixels. A point on the substrate 30 anywhere between two dark spots 300D is located in a relatively high inhibition fringe intensity and therefore is not very susceptible to partial exposure from scattered or diffracted light. Thus, to a first approximation, it is necessary only to consider scattered light from one dark spot 300D to another and permissible to disregard other nearby exposures where the positions of the black holes on the substrate have been changed.

A situation wherein light 56 from the surrounding transducer pixels 152 creates a significant background in an "off" transducer image pixel 58P can be mitigated by not using all the pixels 152 in image transducer 150. In this case, some pixels 152 in image transducer 150 are turned off during the imaging process. There are many ways of achieving a reduced exposure background in "off" pixels 152.

Figure 10:
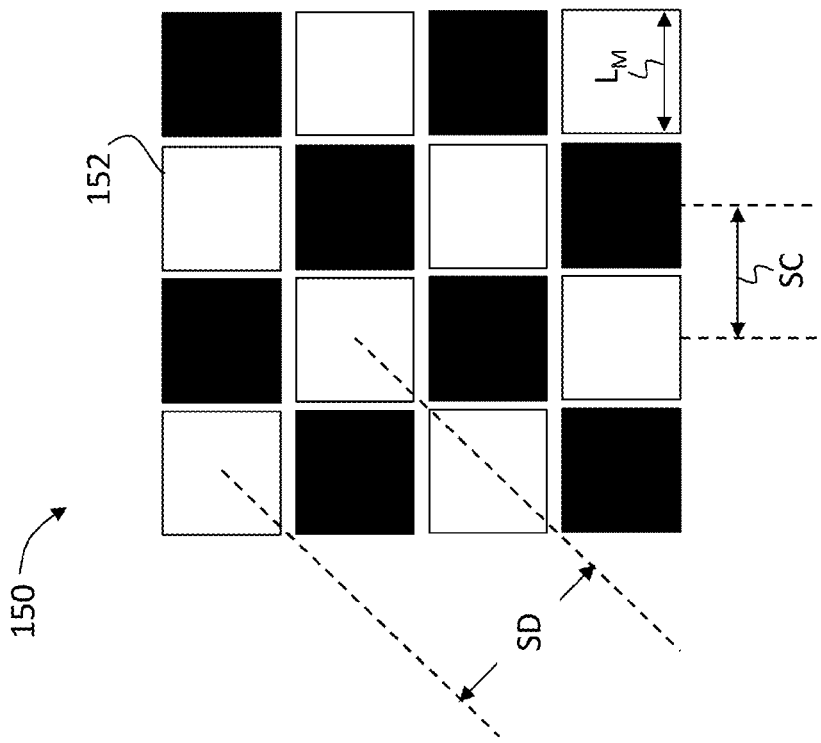
FIG. 10 is a schematic diagram of a portion of the image transducer and illustrates how every other pixel can be turned off to increase the center-to-center distance between the nearest "on" pixels by times the nominal pixel spacing.

FIG. 10 is a schematic diagram of a portion of image transducer 150 and illustrates how every other pixel 152 can be turned off to increase the center-to-center distance between the nearest "on" pixels by $\sqrt{2}$ times the nominal pixel spacing. In this case the pixel-to-pixel spacing is increased, but the image profile remains largely the same. The array of pixels 152 of the image transducer 150 can be made with every other pixel permanently turned off, or the "off" pixels can be swapped with the "on" pixels between scans to keep the micro-mirror duty cycle approximately constant. In this case the only adjacent pixels 152 are on the diagonal, and these add a total contribution of only 4%. The contributions from each of the nearest X- or Y-direction pixels, which are two pixels removed, amounts to only 0.27% each, yielding a total contribution of about 5%.

Figure 11:
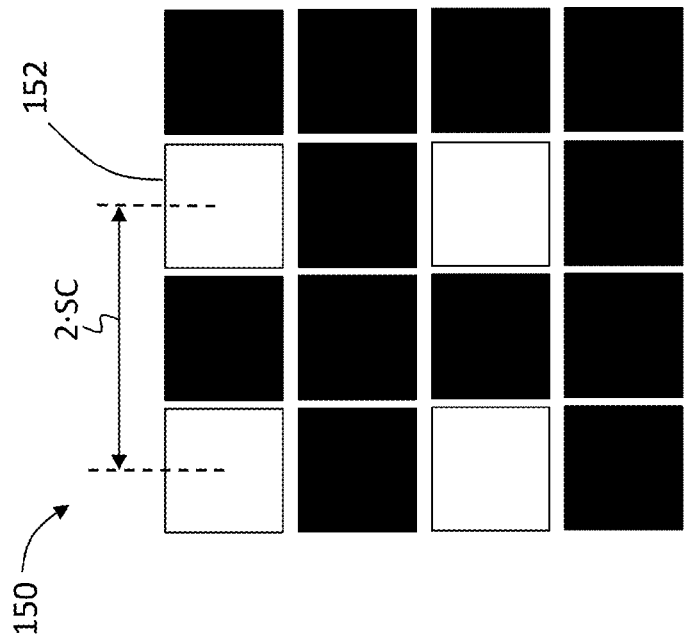
FIG. 11 is similar to FIG. 10 and illustrates how the spacing between active (on) pixels can be increased to twice the pixel spacing distance.

FIG. 11 is similar to FIG. 10 and illustrates how the spacing between active (on) pixels 152 can be increased to twice the pixel spacing distance (2·SC). However, the number of active pixels 152 has been reduced to 1/4 of the total number of pixels. A comparison of the amount of light contributed from nearby pixels is shown in Table 1. The values in the table are only a first approximation to the problem because only the contributions from the nearest and next nearest neighboring pixels have been taken into consideration, and it is assumed that there are no interference effects. Table 1 shows that the checkerboard arrangement reduces the contribution from nearby pixels by almost a factor of 4 and reduces the number of active pixels by a factor 2, which has a direct effect on throughput.

TABLE 1

| Configuration | Every Pixel | Every Other Pixel |
|---|---|---|
| Contribution from nearest X or Y pixel | 6.3% | 0.27% |
| Contribution from nearest diagonal pixel | 1.06% | 1.06% |
| Total contribution from nearest 8 surrounding pixels | 29.4% | 5.32% |

Based on the above analysis, it appears that while one can in principle employ every pixel 152 of a DMD to form transducer image 58, there will be some proximity effects, i.e., contributions to the exposure intensity from nearby pixels. The worst-case exposure addition to a single pixel is estimated to be about 29.4%. Also, the total contributions listed in Table 1 assume a worst-case effect where all the pixels surrounding a pixel of interest are turned on, which may or may not be the case.

Image-Transducer Pixel Size and Shape

Figure 12B:
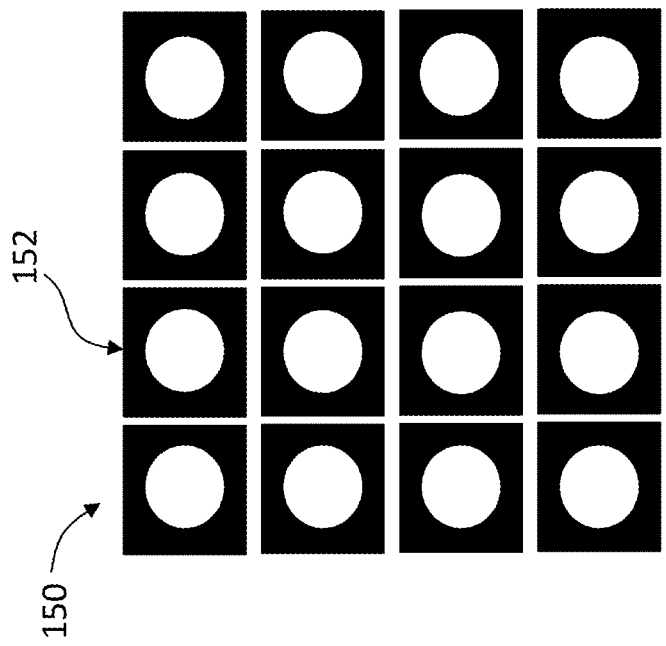
FIGS. 12A and 12B are similar to FIG. 11 and illustrate examples of circular transducer pixels.
Figure 12A:
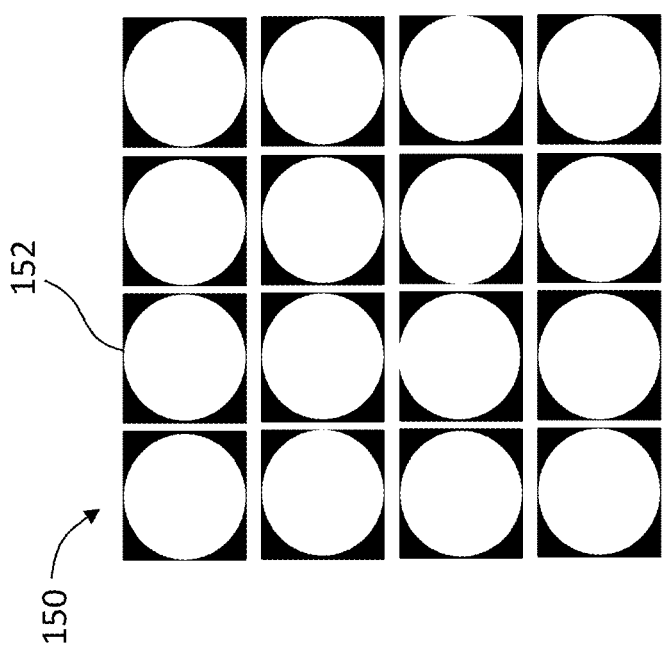

One way of reducing the proximity effect is simply to change the shape of the image-transducer pixel 152. FIG. 12A is similar to FIG. 11 and illustrates an example portion of image transducer 150 wherein the pixel 152 has a circular shape. Assuming the diameter of the circular pixel 152 is equal to the width $L_M$ of the square pixel, the light collection efficiency is reduced by $1-\pi/4=21.5\%$, while the proximity effect is slightly reduced. FIG. 12B is similar to FIG. 12A, but with the reflective portion of each pixel 152 reduced in size.

Figure 13:
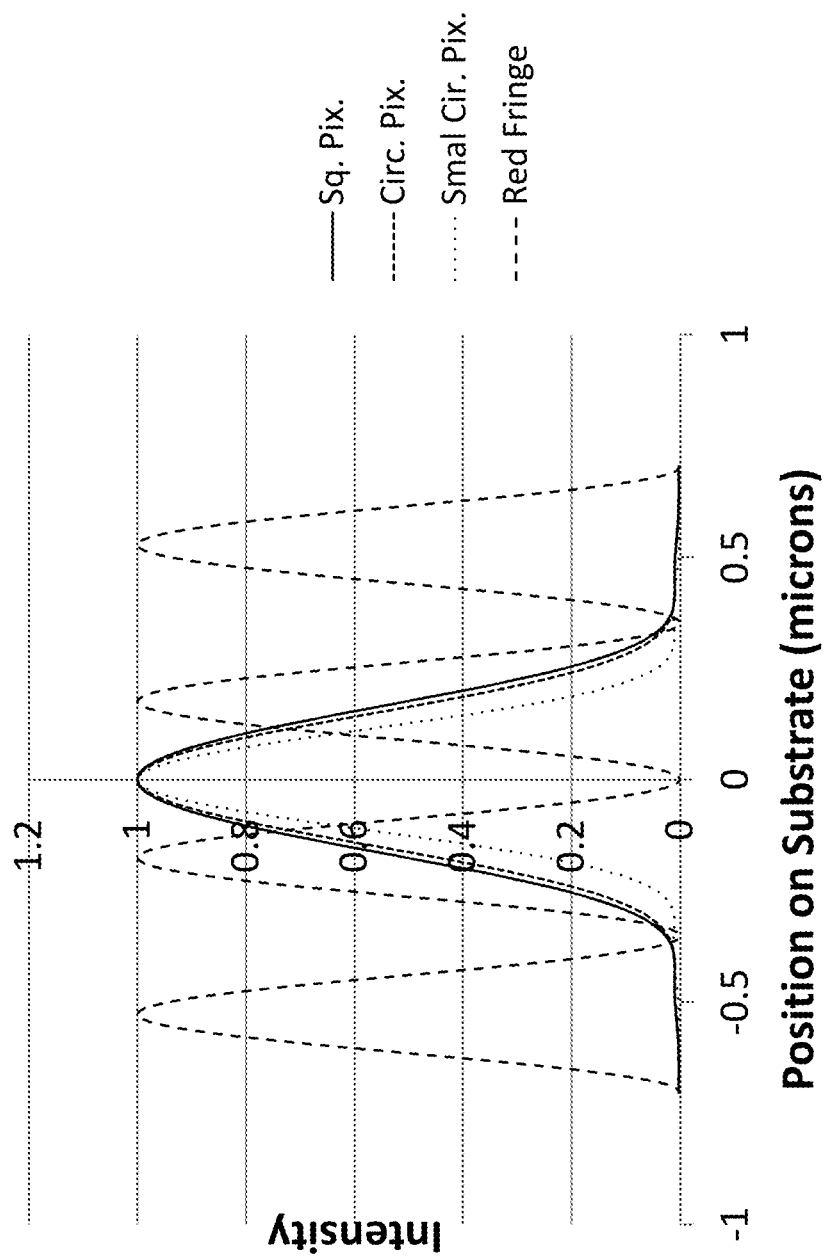
FIG. 13 is a plot of position (microns) versus intensity (normalized) that illustrates simulated intensity profiles for various image-transducer pixel shapes and sizes.

FIG. 13 is a plot of position (microns) versus intensity (normalized) that illustrates simulated intensity profiles for various image-transducer pixel 152 shapes and sizes. In all cases the profile represents a cross-section taken through the middle of the pixel 152 in either the X- or Y-direction. Square pixels 152 have the advantage that they can be packed closely and efficiently illuminated. However, this is not necessarily the optimum arrangement for minimizing the amount of light 56 that can be transferred from one DMD micro-mirror 152 to the center of the image of another DMD micro-mirror.

In the comparison shown in the plot of FIG. 13, the circular pixel 152 has a diameter equal to the width of the square pixel, and the small circular pixel has a diameter equal to 50% of the width of the square pixel. Table 2 summarizes the stray light comparisons for the different shapes and sizes of pixel 152.

TABLE 2

|  | Full Square pixel | Full Circular pixel | ½ Circular Pixel |
|---|---|---|---|
| Contribution from nearest X or Y pixel | 6.3% | 2.93% | 0.72% |
| Contribution from nearest diagonal pixel | 1.06% | 1.04% | 1.1% |
| Total contribution from nearest 8 surrounding pixels | 29.44% | 15.88% | 7.28% |

Interference Effects: Checkerboard Array

Especially for illumination sigma ($\sigma$) values below 1, there are appreciable contributions from pixels 152 that are not near neighbors, and the relative phase of each contribution needs to be taken into account. The phase of the four pixels closest to a reference pixel 152 can be varied by depositing a coating onto these pixels, which adds a phase shift and can influence the contribution from the surrounding pixels. This influence is illustrated in Table 3, which summarizes the following cases for a number of different phase shifts in the pixels 152 immediately surrounding the reference pixel: 1) "All pixels off" refers to the intensity at the reference image center when all the pixels including the reference pixels are off; 2) "Ref. pixel off" refers to the intensity at the reference image center when all the pixels except the reference pixel are on; 3) "Ref. Pixel on" refers to the intensity at the reference image center when all the pixels except the reference pixel are off; and 4) "All pixels on" refers to the intensity at the reference image center when all the pixels including the reference pixel are on.

TABLE 3

Interference effects from surrounding pixels on a checkerboard array

|  | $\sigma = 1$ | $\sigma = 0.5$ | $\sigma = 0$ | Nearest Pixel Phase Shift |
|---|---|---|---|---|
| All pixels off | 0 | 0 | 0 | 0 |
| Ref. pixel off | 0.03283 | 0.00833 | 0.00094 | 0 |
| Ref. pixel on | 1 | 1 | 1 | 0 |
| All pixels on | 1.10959 | 0.84888 | 1.06220 | 0 |
| All pixels off | 0 | 0 | 0 | −45° |
| Ref. pixel off | 0.03165 | 0.00898 | 0.00523 | −45° |
| Ref. pixel on | 1 | 1 | 1 | −45° |
| All pixels on | 1.09325 | 0.90122 | 1.10848 | −45° |
| All pixels off | 0 | 0 | 0 | −90° |
| Ref. pixel off | 0.02882 | 0.01056 | 0.01560 | −90° |
| Ref. pixel on | 1 | 1 | 1 | −90° |
| All pixels on | 1.05380 | 1.02759 | 1.22022 | −90° |
| All pixels off | 0 | 0 | 0 | −135° |
| Ref. pixel off | 0.02599 | 0.01214 | 0.02597 | −135° |
| Ref. pixel on | 1 | 1 | 1 | −135° |
| All pixels on | 1.01436 | 1.15396 | 1.33195 | −135° |
| All pixels off | 0 | 0 | 0 | −180° |
| Ref. pixel off | 0.02481 | 0.01279 | 0.03027 | −180° |
| Ref. pixel on | 1 | 1 | 1 | −180° |
| All pixels on | 0.99802 | 1.20631 | 1.37823 | −180° |

Note that the biggest variations in "Ref. pixel off" and "Ref. pixel on" occur when $\sigma$ equals 0. In this case the optimum value for the phase shift on the closest pixels 152 is zero. If $\sigma$ equals 1, the opposite is true: the optimum phase shift is 180°. For a $\sigma$ value of 0.5, the optimum appears to be zero.

For a typical DMD, the tilt angle tolerance on the micromirrors 152 is quoted as ±1°, which results in a ±2° variation in the direction of the light beam 56R that is reflected from each micro-mirror. This variation turns out to be larger than the half angle subtended by the objective pupil 176, making it necessary to considerably overfill the objective pupil just to ensure that the illumination beam 56 is not vignetted at the pupil. Under these conditions, there is no satisfactory solution to be gained by putting a phase-shifting coating on the nearest neighbor pixels 152. The line-width variation due to proximity effects may be unacceptable even with an optimum phase shift.

An alternative to moving the pixels 152 apart in order to avoid proximity effects appears to be adding sufficient inhibiting radiation so that there is no appreciable partial exposure in the "off" pixels. This can be done by adding interfering inhibition light 256 to the exposure beam 56 that illuminates the image transducer 150, by adding some zero-order interfering inhibition radiation at the center of the pupil 176, by not perfectly balancing the intensities of the interfering inhibition beams, and by illuminating the "off" pixels 152 with inhibition radiation at an angle opposite to the angle employed for the exposure beam. All but the last alternative requires an increase in the exposure intensity in order to offset the raised threshold due to the addition of the inhibition radiation.

A Different Technology has Different Rules

As conventional lithography pushes against the diffraction limit with $k_1$ values approaching the theoretical limit of 0.25, there is a trend toward reducing the pattern entropy, i.e., to simplify the mask pattern so it can be produced with better fidelity and with smoother edges. In some of the most advanced chips, the critical layers appear to be made from an array of equally spaced, parallel lines that are broken or joined to construct the circuit. Such images can best be made with a dipole or a quadrupole illumination scheme.

Employing a similar philosophy with a direct-write system offers strong advantages from a lithographic perspective and also places tight constraints on the circuit designer, but a different technology brings with it different rules. For example, there is no possibility of creating assist features on a DMD used for super resolution, and any analogy to simulating a phase-shift mask on the DMD boils down to the simple solution of putting a 180° phase shift on every other pixel 152 in a checkerboard arrangement.

For apparatus 10 employing a current version of a DMD such as is available from Texas Instruments, it is not feasible to employ any type of partially coherent illumination. Variations in the tilt angle from micro-mirror 152 to micro-mirror and from one device to another make it necessary to overfill the objective pupil 176 simply to ensure a consistent intensity in each pixel image. The best that can be achieved under these conditions is a $\sigma$ value of approximately 1, and changing the phase of adjacent pixels 152 in order to minimize their interaction plays a relatively minor role.

Figure 14:
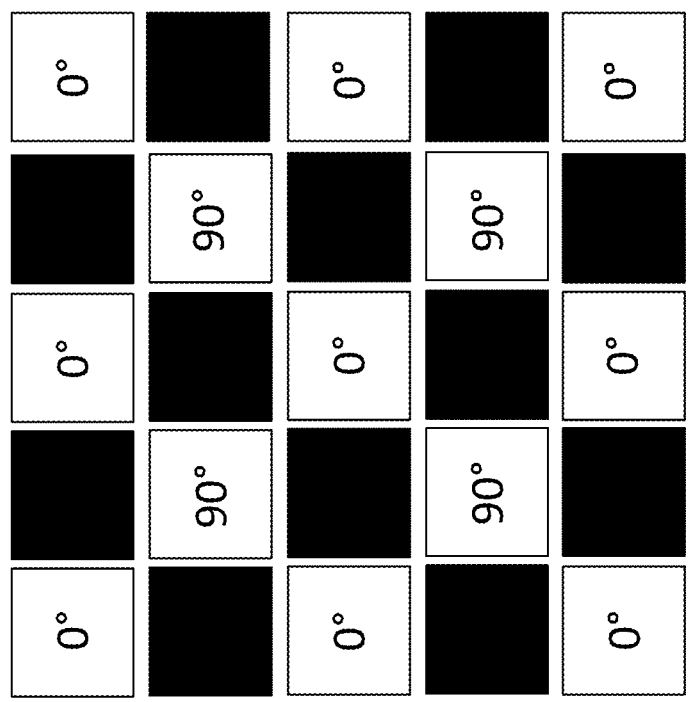
FIG. 14 is a schematic diagram that illustrates an example of how nearest neighbor image-transducer pixels can be phase shifted.

True spatial incoherence is achieved only with $\sigma$ equal to infinity. Thus it still may be worthwhile to shift the phase of the light 56R reflected from the closest pixels 152 by an angle of about 180° to minimize contributions from the surrounding pixels. FIG. 14 illustrates an example of how the nearest neighbor pixels 152 can be shifted in phase. A relative shift of 90°, which corresponds to a quarter wavelength, was chosen as one example for illustrating how a phase shift between nearest neighbors can be organized. FIG. 14 also shows why any phase shift between adjacent pixels 152 has to operate in a complementary manner, i.e., serving to reduce, preferably equally, the interaction between both the unshifted and the phase-shifted pixel groups.

Pixel Writing Strategy

In a typical e-beam system used for writing mask patterns, the finest address structure is typically ⅕ to ⅒ the minimum feature size. This allows the circuit designer great flexibility in the location of pattern edges, but it increases the amount of information that must be handled to make a mask and impedes the throughput. In general, there are several methods of handling address structures that are much finer than the footprint of the writing beam. One method is to superimpose multiple images, each displaced with respect to one another, so that the final image edge is defined by the image edge coming closest to the target. Another method uses gray scaling wherein the beam intensity is modulated so that the critical exposure level, i.e., the exposure level where a small change causes the resist to stay or disappear, is achieved where the line edge is desired. Both methods involve the transfer and writing of large amounts of data, and this impedes the throughput.

With super-resolution lithography (SRL), it is desirable to have some overlap between adjacent pixels 152 in order to minimize line-edge roughness. To a reasonably good approximation, the exposure E in an isolated SRL pixel 152 is an inverted parabola that can be represented by the equation $E=1-ar^2$, where "a" is a constant that depends on the pixel size and r is the radial distance from the pixel center.

Figure 15:
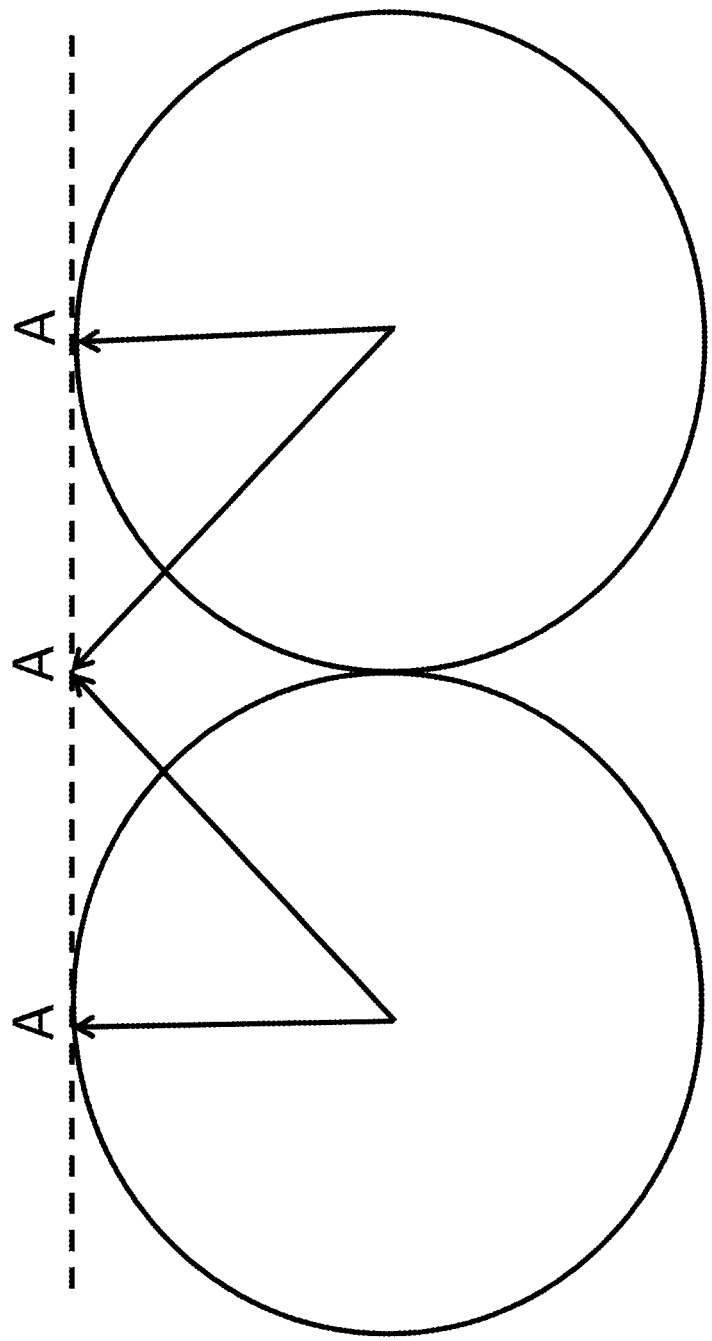
FIG. 15 is a schematic diagram that illustrates one method of minimizing the geometrical line-edge roughness (scalloped edges) caused by butting together circular pixels.

FIG. 15 is a schematic diagram that illustrates one method of minimizing the line-edge roughness that results when circular pixels abut one another. The method involves selecting the constant a so that the exposure dose is the same at the 3 points labeled A, two of which are 5 nm from the pixel center if the pixels are 10 nm in diameter. Thus:

$$E=1-a(5)^2=2(1-a(5^2+5^2))$$

$$a(100-25)=1$$

$$a=1/75=0.013333'$$

The threshold exposure is given by:

$$T=1-5^2/75=0.666$$

Figure 16:
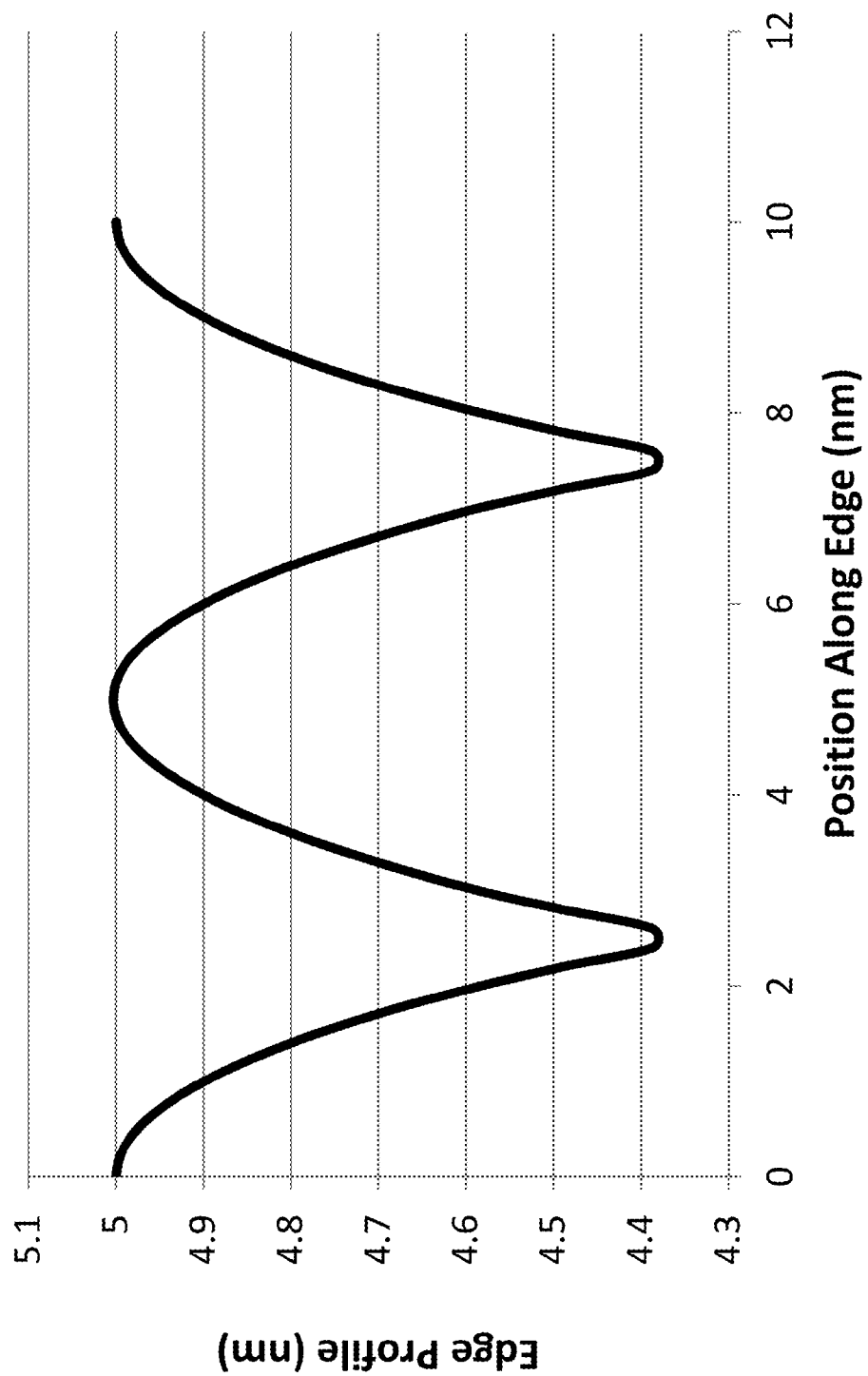
FIG. 16 plots the edge profile (nm) versus position along the edge (nm) for the method illustrated in FIG. 15.

The resulting line-edge profile is shown in FIG. 16, which plots the edge profile (nm) versus position along the edge (nm).

Using a threshold value of 0.666, the geometrical roughness produced by abutting 10-nm pixels is reduced to about 0.6 nm. In this case, the pixel radius measured where the exposure dose equals zero is 8.66 nm. The geometrical line-edge roughness LER would be the same on line edges aligned with the rows and columns of the image-transducer pixels 152 and degraded somewhat on diagonal lines. The ideal threshold value of 0.666 is based on the assumption that no inhibition light 256 is present at the very center of the pixel 152, where the fringe patterns 160X and 160Y have a minimum intensity. If in fact there is some residual inhibition light in the center of the pixel 152, then the amount of exposure light that is effective in producing an exposure dose will be reduced and the ideal threshold value will have to be calculated using the reduced amount of exposure light.

Figure 17:
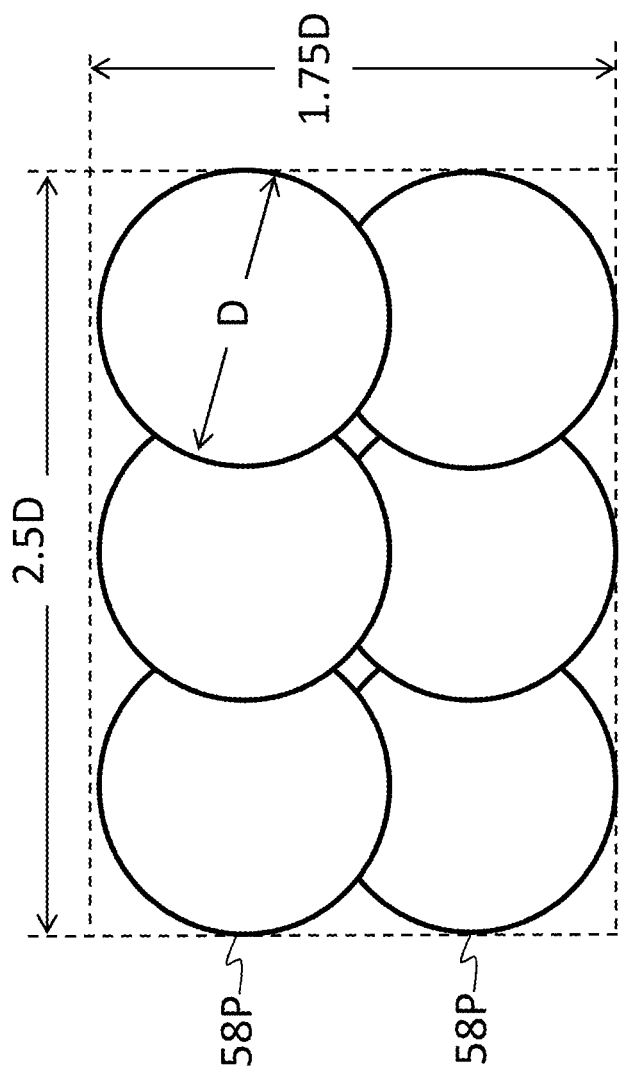
FIG. 17 is a schematic diagram of an example of overlapping pixel images.

In general, overlapping the portions of pixels 152 that, if isolated, would be above the threshold level increases the amount of data that needs to be transferred and results in a bias that must be added to or subtracted from the line width resulting from multiple superimposed pixels. An example of overlapping pixel images 58P is shown in FIG. 17. The edge profile of the resultant line segment is not accurately represented because there are partially exposed areas surrounding each exposed transducer pixel 58P, which, if the pixels are close enough, results in a complete exposure in the space between them. Overlapping pixels 58P lowers the threshold value, which increases the exposure level for a given photoresist 40, steepens the edge slope at the threshold point, and decreases the geometric line-edge roughness.

Filling in the Blank Spaces

Figure 18:
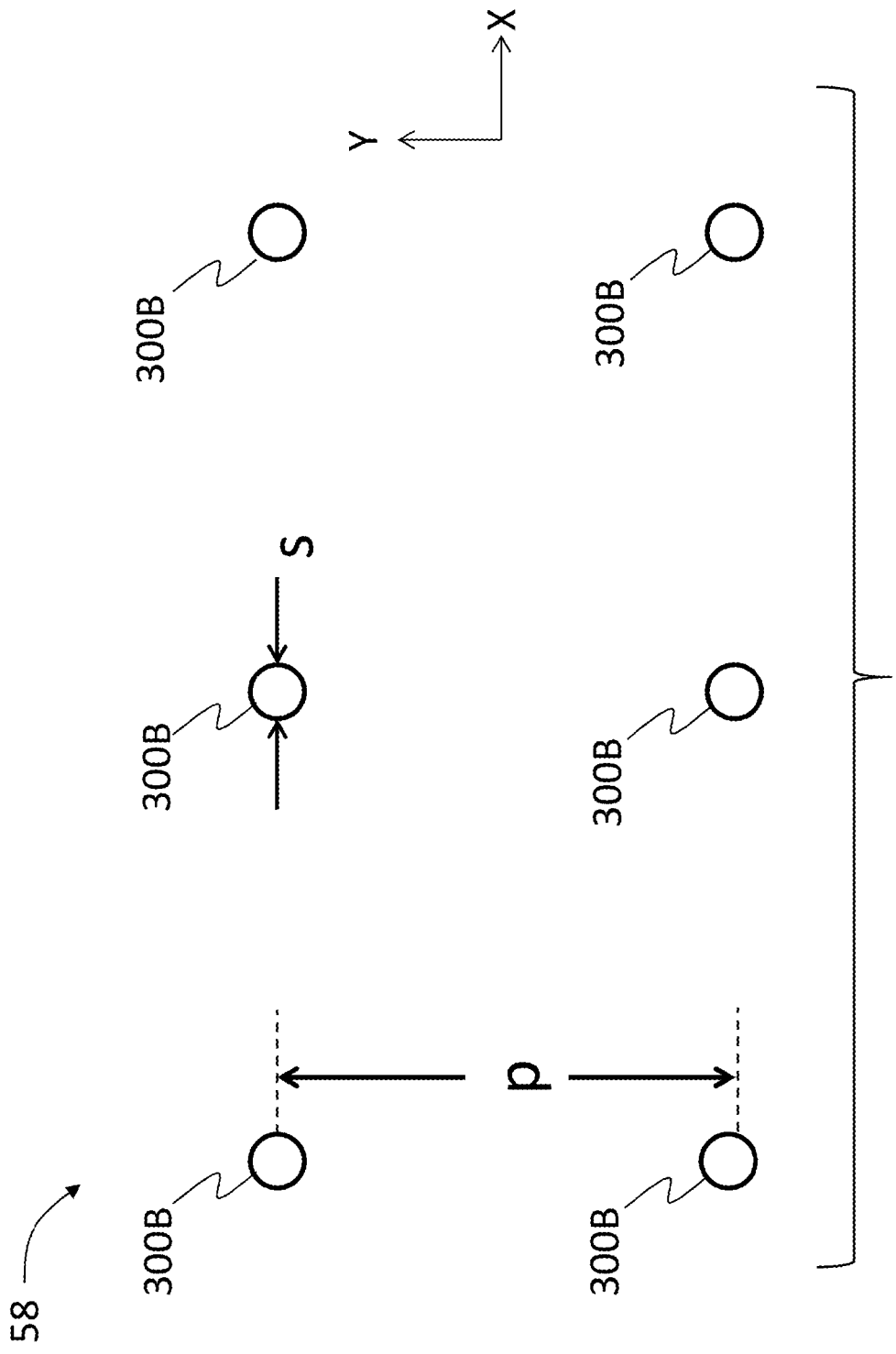
FIG. 18 is a schematic diagram that illustrates a sparse array of bright spots.

In an example operation of apparatus 10, a single exposure of the pattern on image transducer 150 creates via objective lens 170 a sparse array of bright spots 300B. Each bright spot 300B is a small fraction of the width of the distance to the next nearest spot. This is illustrated schematically in FIG. 18, where the width of a bright spot 300B (i.e., of a DMD pixel image 58P) is denoted "s" and the period between spots is denoted "p". The X- and Y-axes are defined by the directions of the rows and columns in the array of image transducer pixels 152, and that scanning is predominately along the Y-axis.

To construct an arbitrary pattern using bright spots 300B, the gaps of this sparse array can be filled in by superimposing multiple exposures. The number of exposures to be superimposed is roughly equal to $(p/s)^2$. If $p/s=N$, N being the number of super-resolution pixels 58P needed to fill the gap between adjacent super-resolution pixels, then the total number of exposures required to fill in the entire area is $N^2$. With a two-dimensional image transducer 150, this can be done in a single scan by employing substrate stage system SS, in particular interferometric positioning system 26, and moving stage 20 and substrate 30 supported thereby in a select manner.

Figure 19:
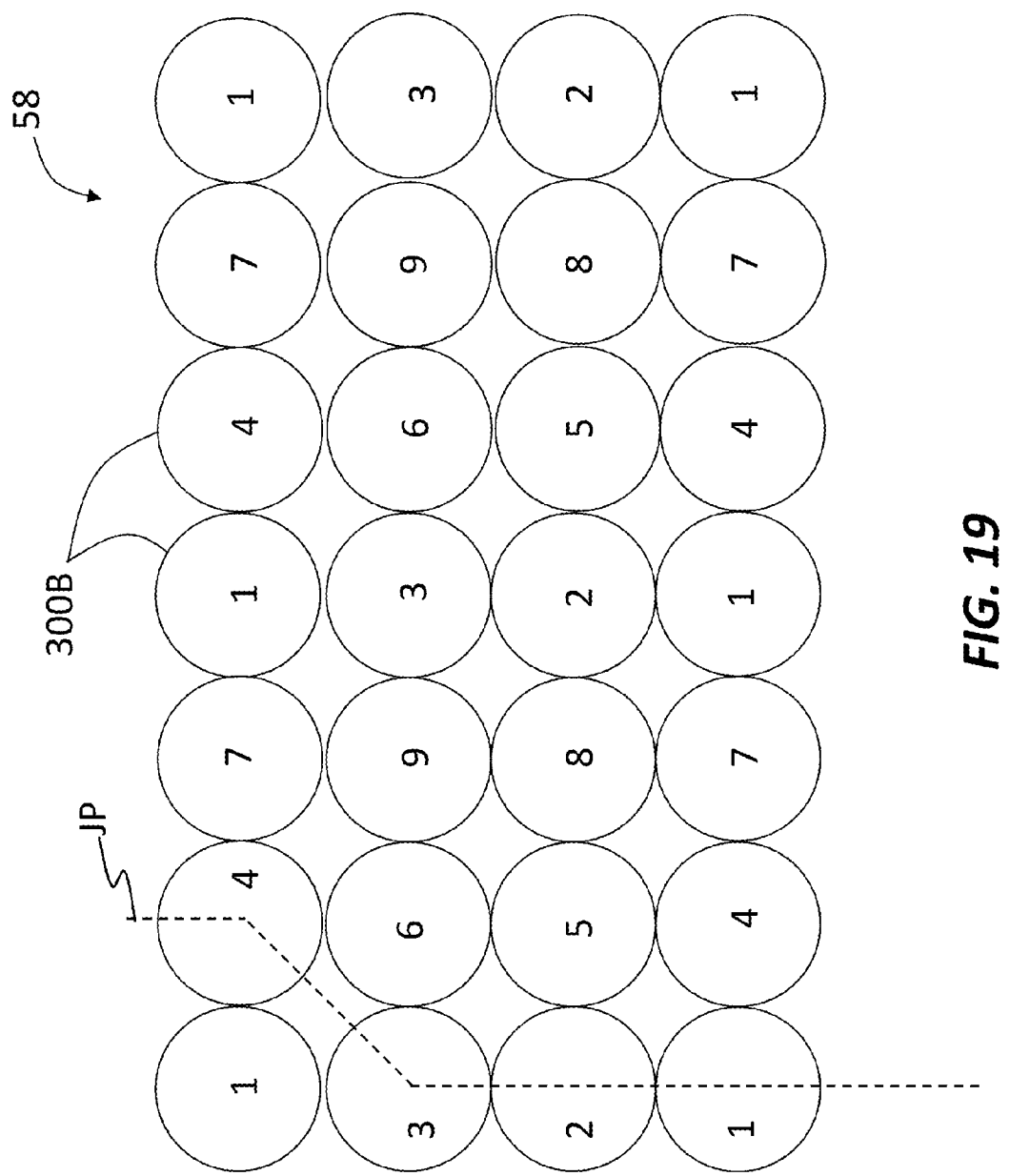
FIGS. 19 and 20 are schematic diagrams that illustrate examples of exposure sequences of bright dots using a sparse array of bright dots to form a denser exposure pattern.

An example exposure sequence is illustrated in FIG. 19, with the number in each bright spot (image pixel) 300B denoting the number of the exposure (i.e., 1=first exposure, 2=second exposure, etc.). Thus, the transducer image 58 of FIG. 19 is actually a composite image formed by multiple exposures. The exposure sequence shown has the advantage that the printed pixels 300B remain aligned with the X- and Y-axes. However, this arrangement of pixels 300B requires that a jogged path JP over to the next column is made each time a column of super-resolution pixels is completed, as illustrated by the dashed line. This jogging is impossible using only substrate stage system SS because the jogged portion in jogged path JP would have to be completed in the time between exposures or in about 30 microseconds.

Figure 20:
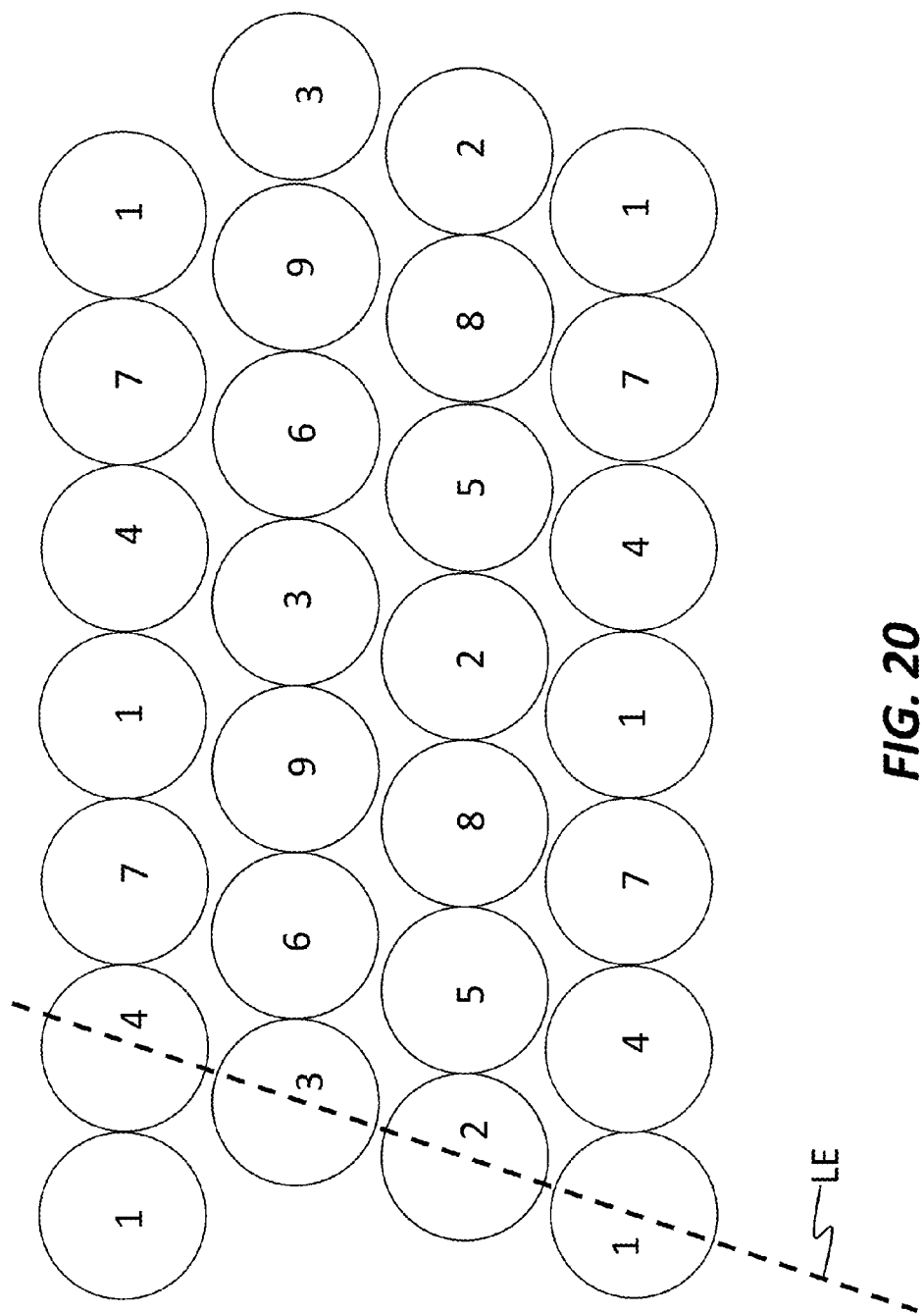

If the stage scan axis is skewed slightly with respect to the column (Y) direction, then the pixels 300B are arranged as shown in FIG. 20. For example, by orienting the stage scan direction slightly off with respect to the orientation of the sparse pattern produced by the image transducer 150, and by incrementing the stage position between each exposure, a line LE of sequentially exposed areas is created. The line LE represents the scan path.

This result can be achieved by employing any one of a number of methods. One method involves moving substrate 30 a distance about equal to s in the Y-direction and about equal to s/N in the X-direction between each exposure, where N is the number of exposures required to complete a single column. Another method involves moving stage 20 a distance about equal to p plus s or several times that distance in the Y-direction between each exposure. The ideal choice is the method that makes the stage motion increment the same each time without double exposing, by either leaving part of the pattern out or not using part of the array of micro-mirrors 152. For example if N exposures are required to span the distance between bright spots 300B generated in the first exposure and the image transducer 150 contained $N^2$ elements in the direction of scan, then incrementing the substrate 30 position a distance about equal to p plus s keeps the distance increment identical between each exposure.

Similarly, if the image transducer 150 has $3N^2$ elements in the direction of scan, then incrementing the position of substrate 30 a distance about equal to 3p plus s keeps the distance increment identical between each exposure. Since each part of the pattern must see a complete traverse of the array of micro-mirrors 152 in order to be completed, all the micro-mirrors 152 in the array are taken full advantage of, although there is some inefficiency at the beginning and end of each scan. It is thus more efficient to scan from one side of substrate 30 to the other than to attempt to expose individual small areas. FIG. 19 illustrates an example showing the number of superimposed exposures $N^2$ required to complete an arbitrary pattern.

The skewed composite transducer image 58 of FIG. 20 presents a data-processing challenge as compared to the composite transducer image of FIG. 19. However, as noted above, the time required for stage 20 to take a sudden step in the X-direction is substantial compared with the time that elapses between frames, and this is unacceptable.

In an example exposure method, the task of stepping in the X-direction is shared by stage 20 and fringe shifters 270, which can be used to move fringes patterns 160X and 160Y in the X-direction. The fringe shifters 270 can be used to carry out the jog in the X-direction. This frees stage 20 to move continuously and smoothly in a slightly skewed direction while fringe shifters 270 keep the dark spots 300D travelling in the Y-direction until a jog in the X-direction is required. This division of the task keeps the orientation of the grid data in the pattern files aligned with the X- and Y-axes of image transducer 150 and simplifies the data processing.

A related concept holds for jogs or non-uniform increments in the spaces between exposures in the scan direction. An example will serve to illustrate the point. Assume that each pixel 300B in transducer image 58 is trimmed by a factor of 20 by interference image 158 so that to completely fill in the spaces remaining after the first exposure, an additional $(N^2-1)=399$ exposures are required. Also assume that there are 1,080 pixels 152 in the scan direction on image transducer 150 and that the scanning system advances only 1 period per exposure. In this case, the entire original pattern will be filled-in long before the trailing edge of the image transducer 150 reaches the top of the original pattern, requiring that most of the transducer be turned off.

Greater efficiency can be achieved by advancing substrate 30 by two periods between exposures, i.e., by doubling the scan velocity and keeping the exposure rate constant. However, doing so still leaves some of the scanner pixels 152 with nothing to do before the trailing edge of the image transducer 150 reaches the leading edge of the first exposure. Ideally, the incremental motion of substrate 30 is equal to the number Q of image-transducer pixels 152 in the scan direction divided by $N^2$. In the above example, $Q/N^2=1080/(20)^2=2.7$. Usually, the ratio $Q/N^2$ is not an integer.

It is impractical to vary the scan speed of stage 20 between exposures. However, by choosing the average value for the scan speed of stage 20, (2.7p/increment of time between exposures) and by varying the number of periods p between successive exposures with the layout data and adjusting the fringe positions, a non-integer ratio such as 2.7 is obtained.

For example, 280 advances of 3 periods each interleaved with 120 advances of 2 periods each yield a total advance of 1,080 periods in 400 exposures. To operate image transducer 150 at full efficiency when the average stage motion increment between exposures is a fractional number of image-transducer pixel images 152, the fringe interference image 158 must be moved quickly using fringe shifters 270.

Operational Modes

The apparatus 10 is configured via controller CO to carry out different methods of superimposing successive exposures. These methods include:

Step-and-Expose (a.k. A Step-and-Repeat):
where the stage position is incremented, an exposure is made, then the stage position is incremented again, another exposure is made, and so on.

Scan-and-Flash:
where the stage moves continuously and the exposing light source is flashed each time the next target position is reached. The pattern in the image transducer is changed between flashes.

Compensated Scan-and-Flash:
identical to scan-and-flash, except the black holes are moved in synchronism with the motion of the stage during the flash.

The step-and-expose mode of operation requires that stage 20 accelerate, decelerate and then pause until the resultant vibrations have died down before an exposure takes place. This method is simple but slow and is not well suited to volume production. The scan-and-flash method of operation is better suited to high-volume production rates but results in some image smearing in the scan direction. Higher scan speeds require higher illuminator intensities, and there are practical limits to the maximum illumination intensity. The compensated scan-and-flash method of operation is best suited to high-volume manufacture and high-resolution imagery. This method places relatively modest requirements on the illuminator system IL, and there is no compromise in image quality.

Laser Power and Flash Duration

The scan-and-flash method keeps the stage 20 moving at a constant velocity, but to avoid image smearing the flash duration must be quite short. For example, with a typical DMD, the maximum frame rate is 20,000 frames per second. If we assume that the stage 20 travels a distance equal to 3p between exposures and that s=p/20 and the maximum allowable image smear is s/4, then the flash duration has to be about $1/(3\times20\times4)=1/240$ of the flash duty cycle. This is about equal to 0.208 microseconds. The instantaneous laser intensity at the substrate 30 is equal to 240,000 W/cm$^2$ for a 50 mJ/cm$^2$ exposure dose.

In the compensated scan-and-flash method of operation, the dark spots 300D of interference image 158 defining the exposure area are moved in synchrony with the substrate 30 during the exposure. The locations of the dark spots 300D can easily be locked to the position of stage 20 using the fringe shifters 270 so that they move with the stage during an exposure. This is easily done using an electro-optical device for fringe shifters 270, which allows the fringes to be locked to the substrate position using a very high bandwidth servo.

Assuming the exposure can be done while the dark spots 300D travel across half a pixel and that the total travel between exposure flashes is 3 pixels, then the flash duration is $1/(2\times3)=\frac{1}{6}$ of the flash duty cycle or about 8.33 microseconds, and the instantaneous laser intensity is about 6,000 W/cm$^2$. Thus the compensated scan-and-flash mode reduces the required laser intensity by a factor of 40 and substantially or completely eliminates image smear resulting from the scan velocity.

Keeping the pattern scan axis aligned with the image-transducer array 152 requires periodic jogs in fringes 160X and 160Y running in the cross-scan direction and that the exposure take place while the dark spots 300D traverse the top portion of the exposure image profile. Assuming the top portion of the exposure image is about equal to p/2, the allowable exposure time expands to about ⅙ of the duty cycle, which is an increase of 40 times over that of the uncompensated step-and-flash mode. The corresponding laser power required is about 11 watts. At a wavelength of 405 nm, this amount of power can be obtained from about two-dozen laser diodes 52. However, manufacturing errors can result in a tilt angle variation of ±1° in the DMD micro-mirrors 152, resulting in a deflection angle error of ±2°.

The theoretical NA of the illumination beam 56 incident on image transducer 150 is the NA of the objective lens 170 divided by the magnification ratio M, i.e., 0.9/36.61=0.0246, which corresponds to a cone angle of 2·arcsin(0.0246)=2.82°. To be certain that the objective lens pupil 176 is filled with reflected light 56R, it is be necessary to overfill the pupil with illumination spread in the direction of the tilt angle by an extra 4°. This overfilling could increase the laser power required by light source LS by a factor of (2.82+4)/2.82=2.42 or to a total of about 27 watts, in addition to whatever additional light 56 is required to make up for transmission losses between the light source and substrate 30. If the laser diodes 52 are turned on only for exposure and are off most of the time, then they can be operated at a higher power level than would be the case were they operated continuously. This duty-cycle advantage can be used to reduce the total power by half.

Achieving Fringe Stability

One of the problems that beset most interferometer systems is how to maintain the thermal homogeneity of the air path through which the different beams pass. To position the dark spots 300D to ¹⁄₁₀₀ of a fringe spacing, the interference image 158 needs to be stable to ¹⁄₁₀₀ of fringe pattern 160X or 160Y. This requires a path temperature difference of no more than 0.006° C., assuming a 300-mm path length.

The best environmentally controlled chambers provide a temperature stability of about 0.1° C., provided there are no heat-generating elements, such as a stage, contributing convection currents to the air path. To stabilize the positions of dark spots 300D, it will be necessary to monitor the positions of the dark spots and correct any positioning errors using fringe shifters 270. Since this monitoring will be necessary in both the X- and Y-directions, at least one fringe shifter 270 is employed in each pair of interferometer arms of interference pattern generator IPG.

Figure 21:
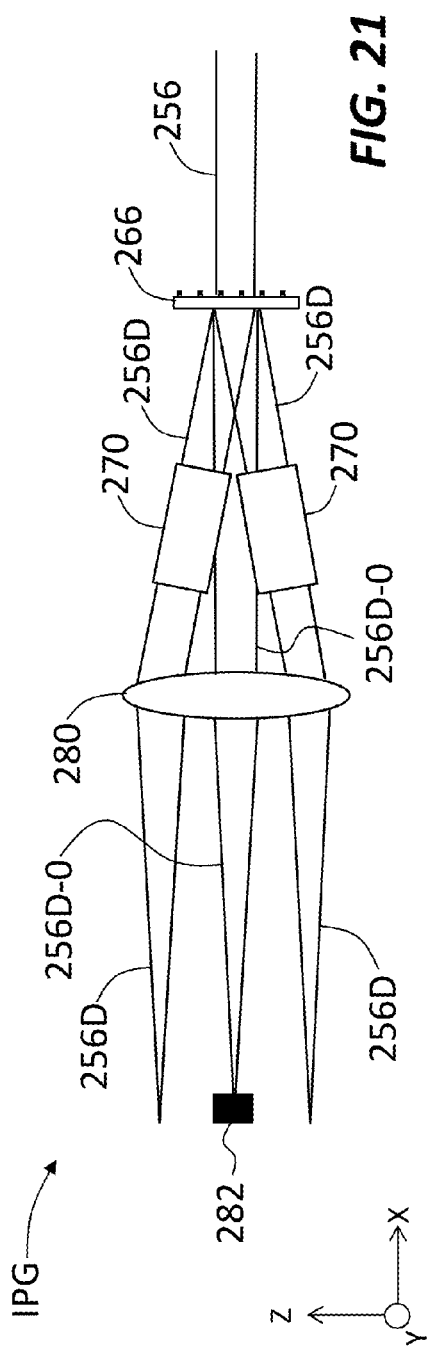
FIG. 21 is a close-up side view of a portion of the interference pattern generator showing a light-blocking member that blocks the 0th-order diffracted beam.
Figure 22:
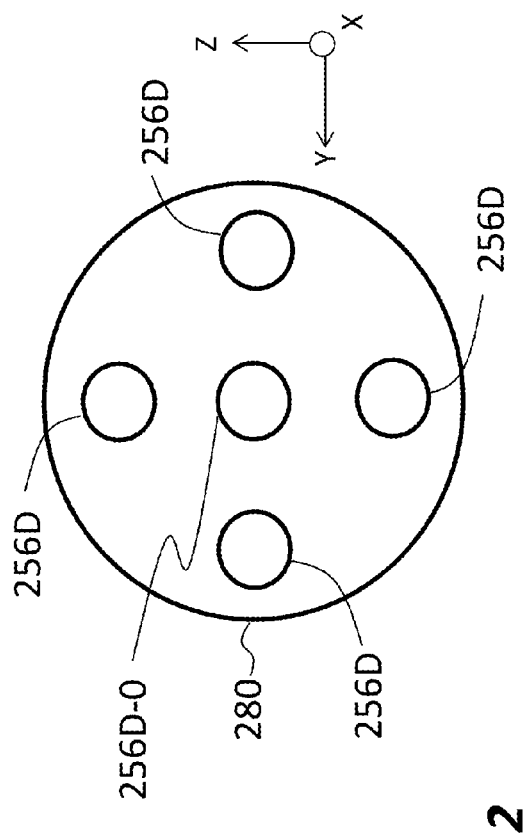
FIG. 22 is a view of a portion of the interference pattern generator looking in the X-direction into the collimating lens and shows an example positioning of the four diffracted light beams, along with the 0th-order light beam.

If fringe shifters 270 employ acoustic modulators, then two acoustic modulators are provided in each path, as shown in FIG. 21. Two acoustic modulators are required because each modulator introduces a small wavelength shift. To obtain a stationary fringe patterns 160X and 160Y, these wavelength shifts must be equal. The other fringe shifters 270 are in the orthogonal beam, which is normal to the plane of FIG. 21, and are shown in the elevated view of FIG. 2B. Monitoring the positions of fringes 160X and 160Y in interference image 158 can be done using alignment system AS, optionally in combination with filter(s) 354, which filter out exposure light 56 of wavelength $\lambda_1$. One way of measuring the exact position (phase) of the fringes 160X and 160Y in interference image 158 is by taking a fast Fourier transform (FFT) of the image of the fringes and analyzing changes in the phase components of the FFT image. The FFT can be performed in controller CO.

Exposure Fringes

A potential increase in the efficiency of illuminating image transducer 150 approaching a factor of 2 can be achieved by also illuminating the image transducer with orthogonal fringes created from an exposure light source or sources. The exposure fringes are generated in a fashion exactly analogous to the generation of the inhibition fringe patterns 160X and 160Y. For example, two orthogonally oriented phase gratings 266 are illuminated with spatially coherent illumination, the residual zero order is eliminated, and the ±1 diffraction-order beams from each grating are combined at the correct angle to create the desired interference pattern on the image transducer 150.

Throughput

In the above example, which employed exposure light 56 at a wavelength of 405 nm and an objective lens 170 with an NA of 0.9, 18-nm diameter pixels 40P are produced. If only every other pixel (micro-mirror 152) of DMD array 150 is potentially useful, then 1,080×1,920/2=1,036,800 pixels 40P can be written per frame. The maximum frame rate for a 1,080 DMD is 20 kHz. Thus $2.07 \times 10^{10}$ pixels 40P per second can be printed in photoresist layer 40. This rate corresponds to an area rate of $(2.07 \times 10^{10}/s)(18 \text{ nm})^2 = 6.72 \times 10^{12}$ nm$^2$/s or 6.72 mm$^2$/s. Writing a layer of photoresist pixels 40P on a 2-cm$^2$ chip would take about 200/6.72=29.8 seconds.

Apparatus Improvements

The resolution of apparatus 10 can be extended by increasing the NA of objective lens 170 to 1.33, thus making the objective an immersion lens. In addition, the inhibition wavelength $\lambda_2$ might be extended to about 300 nm. These two improvements would increase the resolution from 16.4 nm to 16.4(0.9/1.33)(300/532)=6.3 nm. Typical DMDs cannot operate below 290 nm because the internal lubricant used for the micro-mirrors 152 is damaged by short-wavelength light. Thus, extending the exposure wavelength $\lambda_1$ to about 230 nm would require either a different lubricant or eliminating the need for a lubricant. Further advances might also be achieved with improvements in the spectrally sensitive resist overcoat layer.

It is noted that typical commercially available DMDs were not designed for lithographic applications. The typical market for DMDs is for projection TVs and optical projectors in general, in which the resolution of the human eye plays an important role and limits the practical number of pixels. Without such commercial constraints, it is believed that the number of micro-mirrors 152 for a lithography specific DMD could be increased twentyfold and the frame rate tripled to yield a sixtyfold throughput increase, measured in pixels/s. This would allow apparatus 10 to write $60 \times (2.07 \times 10^{10}$ pixels/s)=$1.24 \times 10^{12}$ pixels/s. Taking an improved resolution of 5.5 nm into account, the area rate would be $(1.24 \times 10^{12}$ pixels/s)$(5.5 \text{ nm})^2 = 3.76 \times 10^{13}$ nm$^2$/s=37.6 mm$^2$/s. Writing a 2-cm$^2$ chip would take about 5.3 seconds, and this chip could contain 8.9 times more circuitry than the previous example.

An aspect of the disclosure includes printing photoresist pixels 40P using multiple apparatuses 10. For example, a two-dimensional array of apparatuses 10 would be positioned over wafer 30 so that each apparatus would only be required to write an area equal to its footprint, which in an example is 50 mm by 50 mm Thus, a total of 32 apparatuses 10 can cover the area of a 300-mm-diameter wafer. The time taken to write this area would be about (50 mm)$^2$/(37.6 mm$^2$/s)=66.5 seconds. After adding an additional 10 seconds for load/unload, this corresponds to a throughput of about 47 wafers/hour at a resolution as small as about 5.5 nm.

It will be apparent to those skilled in the art that various modifications and variations can be made to the present disclosure without departing from the spirit and scope of the disclosure. Thus it is intended that the present disclosure cover the modifications and variations of this disclosure, provided they come within the scope of the appended claims and their equivalents.

What is claimed is:

1. A direct-write lithography apparatus for printing sub-resolution pixels in a photoresist layer on a substrate, comprising:
   a movable stage system configured to movably supports the substrate;
   an illumination system configured to provide illumination light of an exposure wavelength capable of activating the photoresist;
   at least one image transducer having an array of configurable transducer pixels arranged to receive and selectively modulate the illumination light;
   an objective lens arranged to receive the modulated illumination light from the at least one image transducer and form on the photoresist layer a transducer image having an arrangement of bright spots;
   an interference pattern generator arranged relative to the objective lens and adapted to generate light beams of an inhibition wavelength capable of inhibiting the activation of the photoresist, wherein the objective lens is configured to receive the light beams to form therefrom on the photoresist an interference image having a grid pattern that defines an array of dark spots, wherein the bright spots are larger than the dark spots, and wherein the transducer image is formed after or simultaneously with the interference image; and
   wherein the stage system and the interference pattern generator are configured to respectively move the substrate and the interference image in synchrony relative to the transducer image to expose the photoresist, with the dark spots traversing at least a portion of corresponding ones of the bright spots so that each first dark spot trims a periphery of the corresponding first bright spot without smearing to form the sub-resolution pixels in the photoresist.

2. The direct-write lithography apparatus of claim 1, wherein the interference pattern generator includes a plurality of fringe shifters configured to shift the grid pattern of the interference image to move the dark spots with respect to the bright spots of the transducer image.

3. The direct-write lithography apparatus of claim 2, wherein the fringe shifters having a servo-bandwidth of 40 kHz or greater.

4. The direct-write lithography apparatus of claim 1, where the configurable transducer pixels are arrayed like white squares on a checkerboard.

5. The direct-write lithography apparatus of claim 1, wherein the substrate includes an alignment mark, and wherein the apparatus further comprises:
   a camera unit arranged to view the substrate through the objective lens to capture an image of the transducer image and the interference image as formed on the substrate; and
   an alignment system operably coupled to the camera unit and the stage system, the alignment system configured to measure relative positions of the superimposed transducer and interference images and the alignment mark.

6. The direct-write lithography apparatus of claim 1, wherein the exposure wavelength is nominally 405 nm and the inhibition wavelength is nominally 532 nm.

7. The direct-write lithography apparatus of claim 1, wherein the substrate has an area and wherein the movable stage system is configured to scan the substrate back and forth at a constant velocity under the objective lens during the exposure and between exposures to expose substantially all of the substrate area.

8. The direct-write lithography apparatus of claim 1, wherein the sub-resolution pixels formed in the photoresist have a size in the range from 5 nm to 100 nm.

9. The direct-write lithography apparatus of claim 1, wherein the transducer pixels are defined by micro-mirrors that have first and second states, and wherein in the first state the micro-mirrors are irradiated with illumination light from a first direction and in the second state are irradiated with inhibition light from a second direction, wherein the exposure light and the inhibition light are directed through the objective lens to the photoresist layer.

10. An apparatus for performing direct-write lithography in a photoresist layer supported by a substrate, comprising:
   means for forming on the photoresist layer two or three interference fringe patterns oriented symmetrically about an axis normal to the photoresist resist layer and having an inhibition wavelength that acts on the photoresist layer to inhibit exposure of the photoresist by an exposure wavelength different from the inhibition wavelength, wherein the interference fringe patterns form an interference image that defines an array of dark spots;
   means for superimposing on the interference image an image of a transducer having an array of transducer pixels with a select orientation that matches that of the dark spots, the transducer image having the exposure wavelength and comprising an array of bright spots that are images of activated transducer pixels in the array of transducer pixels, wherein the transducer image is formed after or simultaneously with the interference image, and wherein the bright spots are larger than the dark spots; and
   means for moving the interference image and the substrate in synchrony while flash exposing the transducer image to scan the dark spots across the bright spots during each flash exposure, wherein each bright spot is trimmed by the corresponding dark spot to form a sub-resolution photoresist pixel having a size smaller than if the dark spot were absent.

11. An apparatus for performing direct-write lithography in a photoresist layer supported by a substrate to form sub-resolution photoresist pixels, comprising:
   a movable stage system that movably support the substrate;
   an objective lens arranged adjacent the substrate;
   an illuminator system configured to generate flashes of illumination light;
   an interference pattern generator arranged relative to the objective lens opposite the substrate and that generates in combination with the objective lens at least two movable interference fringe patterns at the photoresist layer, the at least two interference fringe patterns having an inhibition wavelength that acts on the photoresist layer to inhibit exposure of the photoresist at an exposure wavelength different from the inhibition wavelength, the at least two interference fringe patterns defining a movable interference image having an array of dark spots;
   an image transducer having an array of configurable transducer pixels arranged to receive and selectively modulate the illumination light incident thereon from the illuminator system and to form in combination with the objective lens a transducer image at the photoresist layer, the transducer image having the exposure wavelength and comprising an array of bright spots that are larger than the dark spots of the interference image, wherein the transducer image is formed after or simultaneously with the interference image; and wherein the movable stage system and the interference pattern generator respectively cause the substrate and interference image to move in synchrony while the illuminator system illuminates the transducer with the flashes of illumination light to effectuate scanning of the dark spots relative to the bright spots to expose the photoresist layer to form the sub-resolution photoresist pixels in the photoresist without smearing.

12. The direct-write lithography apparatus of claim 11, wherein the interference pattern generator includes a plurality of fringe shifters configured to shift the at least two movable interference fringe patterns of the interference image to move the dark spots with respect to the bright spots.

13. The direct-write lithography apparatus of claim 12, wherein the fringe shifters having a servo-bandwidth of 40 kHz or greater.

14. The direct-write lithography apparatus of claim 11, wherein the substrate includes an alignment mark, and wherein the apparatus further comprises:
 a camera unit arranged to view the substrate through the objective lens to capture an image of the transducer image and the interference image as formed on the substrate; and
 an alignment system operably coupled to the camera unit and the stage system, the alignment system configured to measure relative positions of the superimposed transducer and interference images and the alignment mark.

15. The direct-write lithography apparatus of claim 11, wherein the exposure wavelength is nominally 405 nm and the inhibition wavelength is nominally 532 nm.

16. The direct-write lithography apparatus of claim 11, wherein the substrate has an area and wherein movable stage system is configured to scan the substrate back and forth at a constant velocity under the objective lens during the exposure and between exposures to expose substantially all of the substrate area.

17. The direct-write lithography apparatus of claim 11, wherein the sub-resolution photoresist pixels have a size in the range from 5 nm to 100 nm.

18. The direct-write lithography apparatus of claim 11, wherein the transducer pixels are defined by micro-mirrors that have first and second states, and wherein in the first state the micro-mirrors are irradiated with illumination light from a first direction and in the second state are irradiated with inhibition light from a second direction, wherein the exposure and inhibition light is directed through the objective lens to the photoresist layer.

19. The direct-write lithography apparatus of claim 11, wherein the objective lens forms a demagnified transducer image.

20. The direct-write lithography apparatus of claim 11, wherein the photoresist has a threshold exposure dose, and wherein each bright spot has an exposure dose that is within a value of 1.333 and 1.82 of the threshold exposure dose.

* * * * *